(12) United States Patent
Ono

(10) Patent No.: US 12,386,252 B2
(45) Date of Patent: Aug. 12, 2025

(54) PELLICLE FILM, PELLICLE, EXPOSURE ORIGINAL PLATE, EXPOSURE DEVICE, AND METHOD FOR MANUFACTURING PELLICLE FILM

(71) Applicant: MITSUI CHEMICALS, INC., Tokyo (JP)

(72) Inventor: Yosuke Ono, Sodegaura (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 18/557,106

(22) PCT Filed: Aug. 25, 2022

(86) PCT No.: PCT/JP2022/032111
§ 371 (c)(1),
(2) Date: Oct. 25, 2023

(87) PCT Pub. No.: WO2023/027159
PCT Pub. Date: Mar. 2, 2023

(65) Prior Publication Data
US 2024/0103357 A1  Mar. 28, 2024

(30) Foreign Application Priority Data
Aug. 26, 2021 (JP) .................... 2021-138015

(51) Int. Cl.
*G03F 1/62* (2012.01)
*G03F 7/00* (2006.01)
(52) U.S. Cl.
CPC .............. *G03F 1/62* (2013.01); *G03F 7/7015* (2013.01)
(58) Field of Classification Search
CPC ..... G03F 1/62; G03F 1/64; G03F 7/62; G03F 7/64
See application file for complete search history.

(56) References Cited

U.S. PATENT DOCUMENTS

2008/0318049 A1  12/2008  Hata et al.
2010/0252184 A1* 10/2010  Morimoto ............. C01B 32/174
                                                        977/902
(Continued)

FOREIGN PATENT DOCUMENTS

CN    108649104 A  * 10/2018
JP    2016126847 A  *  7/2016
(Continued)

OTHER PUBLICATIONS

Goak et al., "Spectroscopic studies and electrical properties of transparent conductive films formed using surfactant stabilized single-wall carbon nanotube suspensions", Carbon, vol. 49 pp. 4301-4313 (Year: 2011).*

(Continued)

*Primary Examiner* — Martin J Angebranndt
(74) *Attorney, Agent, or Firm* — BUCHANAN INGERSOLL & ROONEY PC

(57) ABSTRACT

Provided is a pellicle film, which includes plural carbon nanotubes, in which an average value of linearity parameters represented by the following Formula (1) of the plurality of carbon nanotubes is 0.10 or less:

linearity parameter=standard deviation $Sa$ of a width of single tube/average value $Aa$ of the width    Formula (1):

wherein, in Formula (1), the single tube indicates one carbon nanotube included in the plural carbon nanotubes, each of the standard deviation Sa and the average value Aa is calculated based on 11 measurement values obtained by measuring a width of the single tube at intervals of 2 nm along a longitudinal direction of the single tube.

8 Claims, 14 Drawing Sheets

(56) References Cited

U.S. PATENT DOCUMENTS

| | | | |
|---|---|---|---|
| 2016/0068690 A1* | 3/2016 | Kibe | C09D 7/45 |
| | | | 252/510 |
| 2018/0362752 A1* | 12/2018 | Aqad | C08L 73/00 |
| 2019/0025717 A1 | 1/2019 | Van Der Meulen et al. | |
| 2019/0129300 A1* | 5/2019 | Ono | H01L 21/0274 |
| 2023/0036846 A1 | 2/2023 | Okubo et al. | |
| 2023/0194977 A1 | 6/2023 | Ono et al. | |

FOREIGN PATENT DOCUMENTS

| | | | |
|---|---|---|---|
| JP | 2018145027 A | * | 9/2018 |
| JP | 2019168502 A | * | 10/2019 |
| JP | 2020181212 A | | 11/2020 |
| JP | 2021172528 A | * | 11/2021 |
| KR | 2011139330 A | * | 12/2011 |
| WO | 2006011655 A1 | | 2/2006 |
| WO | WO-2016124068 A1 | * | 8/2016 ............ B64C 27/08 |
| WO | WO-2016140168 A1 | * | 9/2016 |
| WO | 2018008594 A1 | | 1/2018 |
| WO | WO-2018225863 A1 | * | 12/2018 .............. C08K 3/04 |
| WO | 2021/172104 A1 | | 9/2021 |
| WO | 2021210432 A1 | | 10/2021 |
| WO | 2022/196182 A1 | | 9/2022 |

OTHER PUBLICATIONS

Zhou et al., "Highly conducting, durable and large area carbon nanotube thick films for stretchable and flexible electrodes", Appl. Phys. Lett., vol. 114 article 213104 (May 2019) 6 pages.*

Zhou et al., "The use of acids in the exfoliation of carbon nanotubes and its application toward fabricating chemically stable and highly conducting transparent films", Appl. Surf. Sci., vol. 515, article 146027 (Jun. 2020).*

* cited by examiner

PELLICLE FILM, PELLICLE, EXPOSURE ORIGINAL PLATE, EXPOSURE DEVICE, AND METHOD FOR MANUFACTURING PELLICLE FILM

TECHNICAL FIELD

The present disclosure relates to a pellicle film, a pellicle, an exposure original plate, an exposure device, and a method of producing a pellicle film.

BACKGROUND ART

The miniaturization of semiconductor integrated circuits is being promoted by photolithography. In recent years, extreme ultraviolet (EUV) light has been used as the definition of semiconductor integrated circuits has increased. Due to its short wavelength, EUV light is easily absorbed by all gases, liquids, and solids. Therefore, in the exposure method using EUV light, a photomask having a reflective layer for reflecting EUV light is used, and the photomask and an optical system are installed in a vacuum chamber. Exposure using EUV light (hereinafter referred to as "EUV exposure") as the light used for exposure (hereinafter referred to as "exposure light") is performed in a vacuum atmosphere.

However, residual gases (of, for example, moisture and organic substances) may remain in the vacuum chamber, and the EUV light irradiation may cause carbon films to adhere to the surfaces of the mirrors and masks included in the optical system (hereinafter referred to as "contamination"). The occurrence of contamination may cause a decrease in throughput and a deterioration in transfer performance.

As a countermeasure against contamination, instead of disassembling and cleaning the optical system, hydrogen gas is supplied into the vacuum chamber for cleaning the generated contamination in situ (e.g., Patent Literature 1).

A pellicle is attached to the photomask to prevent foreign matter, such as dust, from adhering to the surface of the photomask. The pellicle includes a pellicle film and a pellicle frame that supports the pellicle film. Carbon nanotubes are known as raw materials for pellicle films that are transparent to EUV light (e.g., Patent Literature 1). As a method of producing a single-layer carbon nanotube, the super-growth method (hereinafter referred to as the "SG method") is known (e.g., Patent Literature 2).

Patent Literature 1 Japanese Patent Application Laid-Open (JP-A) No. 2020-181212
Patent Literature 2: WO2006/011655

SUMMARY OF INVENTION

Technical Problem

As a countermeasure against contamination, the hydrogen gas supplied into the vacuum chamber is considered to become hydrogen plasma by irradiation with EUV light. A pellicle film using carbon nanotubes produced by the SG method is likely to experience film reduction when exposed to hydrogen plasma. In a case in which the pellicle film experiences film reduction by hydrogen plasma, the transmittance of exposure light fluctuates during exposure, resulting in a deterioration of transfer performance, which is not preferable.

The disclosure takes into account the above-described circumstances.

An object in one embodiment of the disclosure is to provide a pellicle film that is unlikely to experience film reduction even when exposed to hydrogen plasma, a pellicle, an exposure original plate, and an exposure device.

An object in another embodiment of the disclosure is to provide a method of producing a pellicle film that is unlikely to experience film reduction even when exposed to hydrogen plasma.

Solution to Problem

The solution to solve the above-described problem encompasses the following embodiments.

<1> A pellicle film, which includes a plurality of carbon nanotubes,
wherein an average value of linearity parameters represented by the following Formula (1) of the plurality of carbon nanotubes is 0.10 or less:

$$\text{linearity parameter} = \text{standard deviation } Sa \text{ of a width of one carbon nanotube}/\text{average value } Aa \text{ of the width} \quad \text{Formula (1):}$$

wherein, in Formula (1), each of the standard deviation $Sa$ and the average value $Aa$ is calculated based on 11 measurement values obtained by measuring the width of one carbon nanotube at intervals of 2 nm along a longitudinal direction of the one carbon nanotube.

<2> The pellicle film according to <1>, wherein:
the plurality of carbon nanotubes forms bundles, and
an average value of packing density parameters represented by the following Formula (2) of the plurality of bundles is 0.20 or less:

$$\text{packing density parameter} = \text{standard deviation } Sb \text{ of distances between center points of a plurality of carbon nanotubes constituting one bundle}/\text{average value } Ab \text{ of the distances between center points} \quad \text{Formula (2):}$$

wherein, in Formula (2):
the distances between center points each indicate a length of a straight line that connects center points, each of which is identified as a center point of an annular outline of each of a plurality of carbon nanotubes in a 20-nm×20-nm range of a transmission electron microscope image including one bundle on a cross-section of the pellicle film cut along a thickness direction of the pellicle film, such that a plurality of triangles meeting predetermined conditions are formed;
the predetermined conditions include that sides of each of the plurality of triangles do not intersect, that three of the center points are selected such that a sum of three side lengths of a triangle is minimized, and that an interior angle of an outermost triangle among the plurality of triangles is less than 120°;
each of the standard deviation Sb and the average value Ab is calculated based on a plurality of the distances between center points equal to or less than a predetermined value;
the predetermined value is obtained by multiplying 1.6 times the average value of the distances between center points, starting from a shortest length to a predetermined rank in order of the distances between center points; and
the predetermined rank is indicated by an integer obtained by rounding off to a first decimal place of a number obtained by multiplying a total number of a plurality of the distances between center points by 0.8).

<3> The pellicle film according to <2>, wherein the average value of packing density parameters is 0.15 or less.

<4> The pellicle film according to any one of <1> to <3>, which includes a plurality of carbon nanotubes forming a bundle and has a diffraction peak ratio of 1.3 or more, wherein:
the diffraction peak ratio indicates a ratio of a peak of a second Gauss function that is an element of a second fitting function obtained by fitting a second plotted curve to a peak of a first Gauss function that is an element of a first fitting function obtained by fitting a first plotted curve in a selected area diffraction image of a surface of the pellicle film observed with a transmission electron microscope,
the first plotted curve is a diffraction intensity profile in a direction in which a diffraction intensity from a bundle lattice of a bundle is weak with respect to a scattering vector q,
the second plotted curve is a diffraction intensity profile in a direction in which the diffraction intensity is strong with respect to the scattering vector q,
the first fitting function is a function represented by a sum of a baseline function common to the first plotted curve and the second plotted curve when the scattering vector q is in a range of q=from 1.5 $nm^{-1}$ to 4.0 $nm^{-1}$ and the first Gauss function in which a peak center position of the first plotted curve is in a range of q=from 2.0 $nm^{-1}$ to 3.0 $nm^{-1}$,
the second fitting function is a function represented by a sum of the baseline function and the second Gauss function in which a peak center position of the second plotted curve is in a range of g=from 2.0 $nm^{-1}$ to 3.0 $nm^{-1}$,
the peak of the first Gauss function indicates a local maximum value of the first Gauss function when the scattering vector q is in a range of q=from 2.0 $nm^{-1}$ to 3.0 $nm^{-1}$, and
the peak of the second Gauss function indicates a local maximum value of the second Gauss function when the scattering vector q is in a range of q=from 2.0 $nm^{-1}$ to 3.0 $nm^{-1}$.

<5> The pellicle film according to any one of <1> to <4>, which includes a plurality of carbon nanotubes forming a bundle and has a smoothness evaluation value of 0.070 ($nm^2/nm$) or less, wherein:
the smoothness evaluation value indicates a value obtained by dividing an area between an outline of a carbon nanotube and an approximate curve of the outline by a length of the approximate curve,
the outline is a line obtained by tracing a wall portion of a carbon nanotube (CNT) that appears as a dark line in a transmission electron microscope image of a surface of the pellicle film at a resolution of 100 pixels or more with a length of 5 nm,
the approximate curve is a curve drawn by quadratic spline interpolation of coordinates of the outline of the CNT,
the outline and the approximate curve of the carbon nanotube are extracted from 20 carbon nanotubes, and
the length of the outline per carbon nanotube is 20 nm.

<6> The pellicle film according to any one of <1> to <5>, which includes a plurality of carbon nanotubes forming a bundle, wherein:
a minimum value of a ratio (G/D) of a G-band intensity to a D-band intensity at 7 locations within a predetermined bundle region in a cross-section of the pellicle film, cut along a bundle axial direction is 0.80 or more,
each of the D-band intensity and the G-band intensity is a measurement value obtained by Raman imaging measurement,
the predetermined bundle region indicates a region in a bundle having a diameter of 10 nm or more at a spatial resolution of 20 nm or less in a 500 nm×500 nm measurement area of the cross-section,
the D-band intensity is a local maximum value of Raman scattering intensity in a Raman shift range of from 1300 $cm^{-1}$ to 1400 $cm^{-1}$, and
the G-band intensity is a local maximum value of Raman scattering intensity in a Raman shift range of from 1550 $cm^{-1}$ to 1610 $cm^{-1}$.

<7> A pellicle, which includes:
a pellicle frame; and
the pellicle film according to any one of <1> to <6> which is supported by the pellicle frame.

<8> An exposure original plate, which includes:
a photomask; and
the pellicle according to <7> which is attached to the photomask.

<9> An exposure device, which includes:
an EUV light source that emits EUV light as exposure light;
the exposure original plate according to <8>; and
an optical system that guides the exposure light emitted from the EUV light source to the exposure original plate,
wherein the exposure original plate is arranged such that the exposure light emitted from the EUV light source passes through the pellicle film to be irradiated on the photomask.

<10> A method of producing a pellicle film that is the pellicle film according to any one of <1> to <6>, which includes
a coating step of applying a dispersion liquid, in which a plurality of carbon nanotubes synthesized by a direct injection pyrolytic synthesis method is dispersed, to a substrate.

<11> The method of producing a pellicle film according to <10>, which further includes a cleaning step of alkaline-cleaning a coating film obtained in the coating step.

Advantageous Effects of Invention

According to one embodiment of the disclosure, a pellicle film that is unlikely to experience film reduction even when exposed to hydrogen plasma, a pellicle, an exposure original plate, and an exposure device can be provided.

According to another embodiment of the disclosure, a method of producing a pellicle film that is unlikely to experience film reduction even when exposed to hydrogen plasma can be provided.

DESCRIPTION OF EMBODIMENTS

Figure 1:
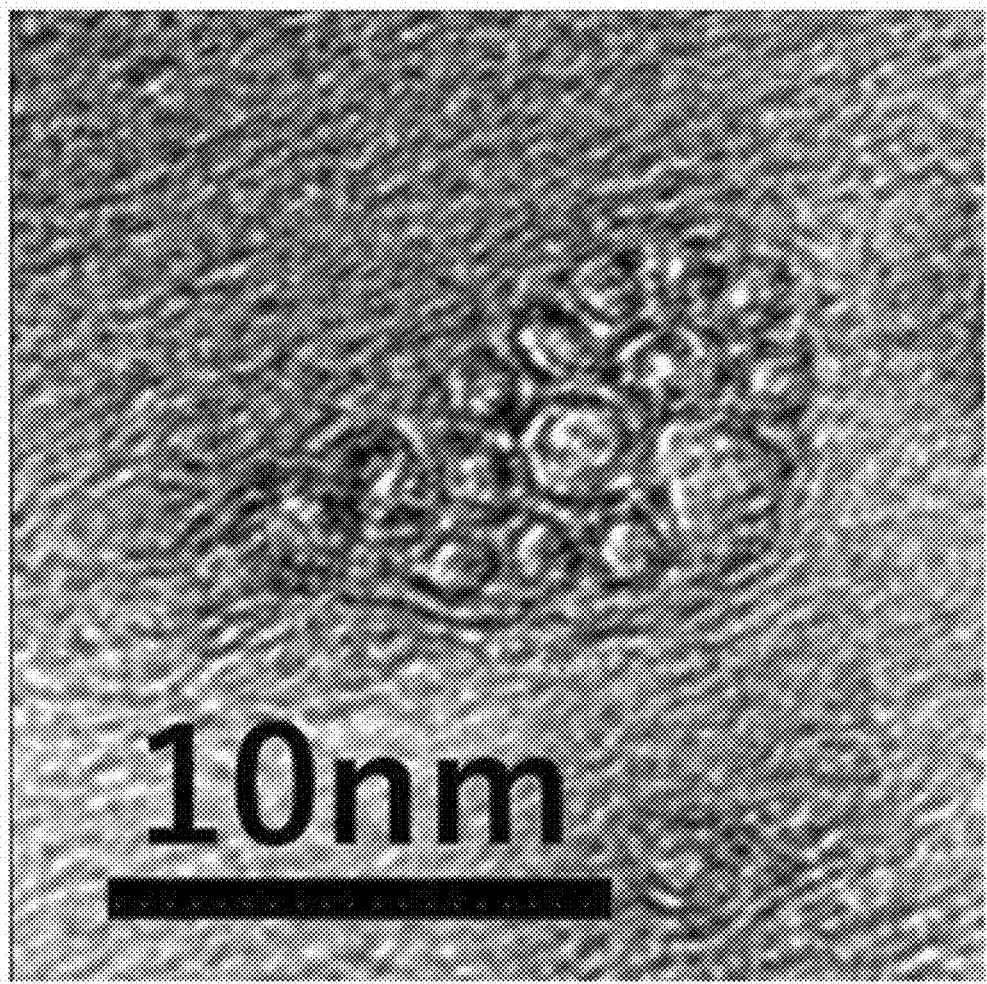
FIG. 1 is a transmission electron microscope (TEM) image of a cross-section of an example single bundle.

In the disclosure, a numerical range indicated using "to" means a range including the numerical values before and after "to" as the minimum and maximum values, respectively.

In the stepwise numerical ranges described in the disclosure, upper or lower limits described in a certain numerical range may be replaced with upper or lower limits of other stepwise numerical ranges described herein. In the numerical ranges described in the disclosure, upper or lower limits described in a certain numerical range may be replaced with values shown in the Examples.

In the disclosure, a combination of two or more preferred aspects is a more preferred aspect.

In the disclosure, the amount of each component means the total amount of a plurality of types of substances unless otherwise specified when there are a plurality of types of substances corresponding to each component.

In the disclosure, the term "step" encompasses not only an independent step, but also a step that cannot be clearly distinguished from other steps, provided that the intended purpose of the step is achieved.

In the disclosure, "EUV light" refers to light having a wavelength of from 1 nm to 30 nm. The wavelength of EUV light is preferably from 5 nm to 13.5 nm.

In the disclosure, the "standard deviation" refers to the positive square root of the variance, and "variance" refers to the arithmetic average of the squares of the deviation (i.e., the difference between the statistic and the average value).

In the disclosure, the "film plane direction" refers to an arbitrary direction parallel to the surface of the pellicle film, and the "film thickness direction" indicates the thickness direction of the pellicle film. The film thickness direction refers to the direction perpendicular to the film plane direction.

(1) First Embodiment (1.1) Pellicle Film

A pellicle film according to the first embodiment includes a plurality of carbon nanotubes (hereinafter referred to as "CNTs"). The average value of linearity parameters represented by the following Formula (1) of a plurality of CNTs is 0.10 or less.

linearity parameter=standard deviation $S_a$ of widths of one CNT (hereinafter referred to as "single tube")/average value $A_a$ of the widths     Formula (1):

In Figure (1), each of the standard deviation $S_a$ and the average value $A_a$ is calculated based on 11 measurement values obtained by measuring a width of the single tube at intervals of 2 nm along a longitudinal direction of the single tube.

The linearity parameter refers to a coefficient of variation (coefficient of variation) of the width of the single tube, which quantitatively expresses the degree of variation of the width of the single tube. A linearity parameter closer to 0 indicates less variation of the width of the single tube and the single tube closer to a straight line.

Hereinafter, the pellicle film is sometimes referred to as "CNT film."

In the first embodiment, as the pellicle film has the above-described configuration, it is unlikely to experience film reduction even when exposed to hydrogen plasma. It is presumed that this is mainly due to the following reasons.

When the average value of linearity parameters of a plurality of CNTs is 0.10 or less, it shows that each of the plurality of CNTs has high linearity from a microscopic viewpoint, and the defect density of each of the plurality of CNTs is low. In other words, when the average value of linearity parameters of a plurality of CNTs is 0.10 or less, it shows that the width of each of the plurality of CNTs is not finely disordered like a saw blade along its longitudinal direction, and the width of each of the plurality of CNTs is nearly uniform. When "the defect density of the CNT structure is 0 (i.e., there is no defect density in the CNT structure)," it shows that no topological defect is introduced into the network (mesh) without missing any carbon atom in the network (mesh) in which carbon atoms are covalently bonded. Topological defects include five- and seven-membered rings.

Sites with structural defects on the surface of CNT tend to appear as sites exhibiting nonlinearity from a microscopic viewpoint (hereinafter referred to as "nonlinear portions"). It is considered that hydrogen plasma mainly promotes the etching of CNTs (i.e., CNTs are decomposed and scraped off) starting from the non-linear portions. The defect density of the structure of each of the plurality of CNTs included in the pellicle film according to the first embodiment is low. Therefore, the number of non-linear portions that serve as starting points for etching with hydrogen plasma is small. As a result, it is presumed that the pellicle film according to the first embodiment is unlikely to experience film reduction even when exposed to hydrogen plasma.

(1.1.1) Linearity Parameter

In the first embodiment, the average value of linearity parameters of a plurality of CNTs is 0.10 or less. From the viewpoint of further suppressing the film reduction of the pellicle film even when exposed to hydrogen plasma, the average value of linearity parameters is preferably 0.08 or less, more preferably 0.07 or less, still more preferably 0.06 or less, particularly preferably 0.05 or less, further preferably 0.045 or less. The closer the average value of linearity parameters is to 0, the more preferable.

The lower limit of the average value of linearity parameters is not particularly limited; however, it can be, for example, 0.001 or more, 0.005 or more, or 0.010 or more.

From these viewpoints, the average value of linearity parameters of a plurality of CNTs is preferably from 0.001 to 0.08, more preferably from 0.001 to 0.07, still more preferably from 0.001 to 0.06, particularly preferably from 0.001 to 0.05, further preferably from 0.001 to 0.045. From another viewpoint, the average value of linearity parameters of a plurality of CNTs is preferably from 0.005 to 0.06, more preferably from 0.005 to 0.05, still more preferably from 0.005 to 0.045. From another viewpoint, the average value of linearity parameters of a plurality of CNTs is preferably from 0.010 to 0.06, more preferably from 0.010 to 0.05, still more preferably from 0.010 to 0.045.

(1.1.1.1) Method of Measuring Linearity Parameter

The average value of linearity parameters of a plurality of CNTs is determined as follows.

<Transfer>

A self-supporting film portion of a pellicle film of a pellicle which will be described later is transferred to an observation grid of a transmission electron microscope (TEM). A "self-supporting film portion of a pellicle film" refers to a region that is not supported by a pellicle frame in a pellicle film. Specifically, a solvent is dropped onto the grid, and the pellicle is placed on the grid with the pellicle film of the pellicle facing the grid. Examples of the solvent include water and an organic solvent. The solvent is dried, and the pellicle film is closely attached to the grid. The grid is immobilized, and the pellicle frame of the pellicle is lifted, thereby separating the self-supporting film portion from the pellicle to allow the self-supporting film portion to be transferred to the grid.

<Surface Observation>

The surface of the self-supporting film portion transferred to the grid is observed using TEM (magnification: from 100,000 times to 600,000 times) from the film thickness direction of the self-supporting film portion, thereby obtaining a plurality of first TEM images. The resolution of TEM is the resolution at which the length of 5 nm is preferably 100 pixels or more, more preferably 200 pixels or more, in a TEM image.

Twenty CNTs are selected from a plurality of first TEM images such that the width of one CNT can be easily recognized.

Hereinafter, each of the 20 selected CNTs is referred to as "single tube."

<Measurement>

The linearity parameter of each of the 20 single tubes is measured. Specifically, the width of the single tube is measured at 2 nm intervals along the longitudinal direction of one of the 20 single tubes using the first TEM images such that the width of the single tube is measured at 11 points. Using the obtained 11 measurement values, the standard deviation Sa of the width of the single tube and the average value Aa of the width of the single tube are calculated. Using the calculated standard deviation Sa and average value Aa, the linearity parameter of the width of the single tube is calculated from Formula (1).

Similarly, the linearity parameter of the width of the single tube is calculated for all 20 single tubes.

The average value of the calculated linearity parameters of the widths of 20 single tubes is calculated. The average value of the calculated linearity parameters of the widths of 20 single tubes is regarded as the average value of linearity parameters of a plurality of CNTs.

(1.1.2) Packing Density Parameter

In the first embodiment, it is preferable that the plurality of CNTs forms a bundle, and the average value of packing density parameters represented by the following Formula (2) of the plurality of bundles is 0.20 or less.

packing density parameter=standard deviation $Sb$ of distances between center points of a plurality of CNTs constituting one bundle (hereinafter referred to as "single bundle")/average value $Ab$ of the distances between center points    Formula (2):

In Formula (2), the distances between center points each indicate a length of a straight line that connects center points, each of which is identified as a center point of an annular outline of each of a plurality of CNTs in a 20 nm×20 nm range of a transmission electron microscope image including a single bundle on a cross-section of the pellicle film cut along a thickness direction of the pellicle film, such that a plurality of triangles meeting predetermined conditions are formed.

The predetermined conditions include that sides of each of the plurality of triangles do not intersect, that three of the center points are selected such that a sum of three side lengths of a triangle is minimized, and that an interior angle of an outermost triangle among the plurality of triangles is less than 120°.

Each of the standard deviation Sb and the average value Ab is calculated based on a plurality of the distances between center points equal to or less than a predetermined value.

The predetermined value is obtained by multiplying 1.6 times the average value of the distances between center points, starting from a shortest length to a predetermined rank in order of the distances between center points.

The predetermined rank is indicated by an integer obtained by rounding off to a first decimal place of a number obtained by multiplying a total number of a plurality of the distances between center points by 0.8.

In the disclosure, the "total number of a plurality of distances between center points" refers to the number of a plurality of distances between center points in total, which means the total number of straight lines connecting center points.

The packing density parameter indicates the coefficient of variation of distances between center points of a plurality of CNTs constituting a single bundle and quantitatively shows the degree of variation of distances between center points of a plurality of CNTs constituting a single bundle. When the packing density parameter is closer to 0, it indicates less variation of distances between center points of a plurality of CNTs constituting a single bundle, meaning that the CNTs constituting a single bundle are packed hexagonally without gaps.

The distance between center points including the outermost center point tends to be longer than the other distances between center points and is prone to noise when the packing density parameter of a plurality of bundles is evaluated.

In Formula (2), each of the standard deviation Sb and the average value Ab is calculated based on a plurality of distances between center points equal to or less than a predetermined value as described above. Thus, such noise can be eliminated.

The details of the conditions for calculating the average value of packing density parameters will be described.

The predetermined conditions for triangulating the collection of CNT center points including that "sides of each of the plurality of triangles do not intersect"and that" three of the center points are selected such that a sum of three side lengths of a triangle is minimized" are known as the Delaunay triangulation.

In the first embodiment, to evaluate the distance between center points of CNTs adjacent to each other when triangulating the collection of CNT center points, a constraint condition that "an interior angle of an outermost triangle among a plurality of triangles is less than 120°" is added in addition to the above-described conditions for the Delaunay triangulation.

Further, when calculating the average value of packing density parameters, a calculation condition that "each of the standard deviation Sb and the average value Ab is calculated based on a plurality of distances between center points equal to or less than a predetermined value among all distances between center points" is imposed.

Generally, in the Delaunay triangulation method, a set of points is connected in a convex hull. When triangulating a set of points, a convex hull shape is formed by forming a side by connecting two points located outside the set of points. When forming this convex hull shape, there is a case in which two points positioned far from each other are connected.

In the first embodiment, a side formed by connecting such two CNT center points positioned far from each other is not necessarily a side formed by connecting two center points of adjacent CNTs but a side formed by connecting the center points of two CNTs that are not close to each other across a plurality of CNTs. In this case, the length of a side formed by connecting two points positioned far from each other is not the distance between center points of adjacent CNTs and refers to the distance between center points of CNTs positioned far from each other.

To evaluate the packing state of CNTs, it is essential to evaluate the distance between center points of two CNTs constituting a bundle that is close to or adjacent to each other and the distribution and variation of the distance. In other words, it is inappropriate to include the length of the side connecting the two center points of the outer CNTs that are far apart in the triangulation method (distance between center points) in the average value of packing density parameters because it can be a noise component that overestimates the packing density parameter.

For the above reasons, it is possible to extract the distance between center points of CNTs adjacent to each other by adding the above-described constraint condition to the conditions for the Delaunay triangulation when triangulating a set of center points of CNTs. Further, when calculating the average value of packing density parameters, a noise component that overestimates the packing density parameter can be eliminated by imposing the above-described calculation conditions. As a result, the packing density parameter, which is the coefficient of variation (coefficient of variation) of distances between center points of a plurality of CNTs constituting a single bundle, is evaluated with high accuracy (with fewer noise components).

As long as the average value of packing density parameters of a plurality of bundles is 0.20 or less, a pellicle film is less likely to experience film reduction even when exposed to hydrogen plasma. It is presumed that this is mainly due to the following reasons.

When the average value of packing density parameters of a plurality of bundles is 0.20 or less, it indicates that a plurality of CNTs constituting a single bundle is densely packed and aggregated. Therefore, hydrogen plasma cannot diffuse and reach the inside of the single bundle, and the effects of etching with hydrogen plasma and the like are reduced. As a result, it is presumed that the pellicle film is less likely to experience film reduction even when exposed to hydrogen plasma.

The average value of packing density parameters of a plurality of bundles is preferably 0.20 or less. From the viewpoint of further suppressing the film reduction of the pellicle film even when exposed to hydrogen plasma, it is preferably 0.15 or less, more preferably 0.10 or less. The closer the average value of packing density parameters to 0, the more preferable. When the average value of packing density parameters of a plurality of bundles is 0, it shows that all CNTs constituting a single bundle are arranged in a hexagonal crystal structure at equal intervals, i.e., a close-packed structure.

The lower limit of the average value of packing density parameters of a plurality of bundles is not particularly limited and can be, for example, 0.01 or more, 0.02 or more, or 0.05 or more.

From these viewpoints, the average value of packing density parameters of a plurality of bundles is preferably from 0.01 to 0.20, more preferably from 0.01 to 0.15, still more preferably from 0.01 to 0.10, particularly preferably from 0.02 to 0.10, further preferably from 0.05 to 0.10.

(1.1.2.1) Method of Measuring Packing Density Parameter

Figure 2:
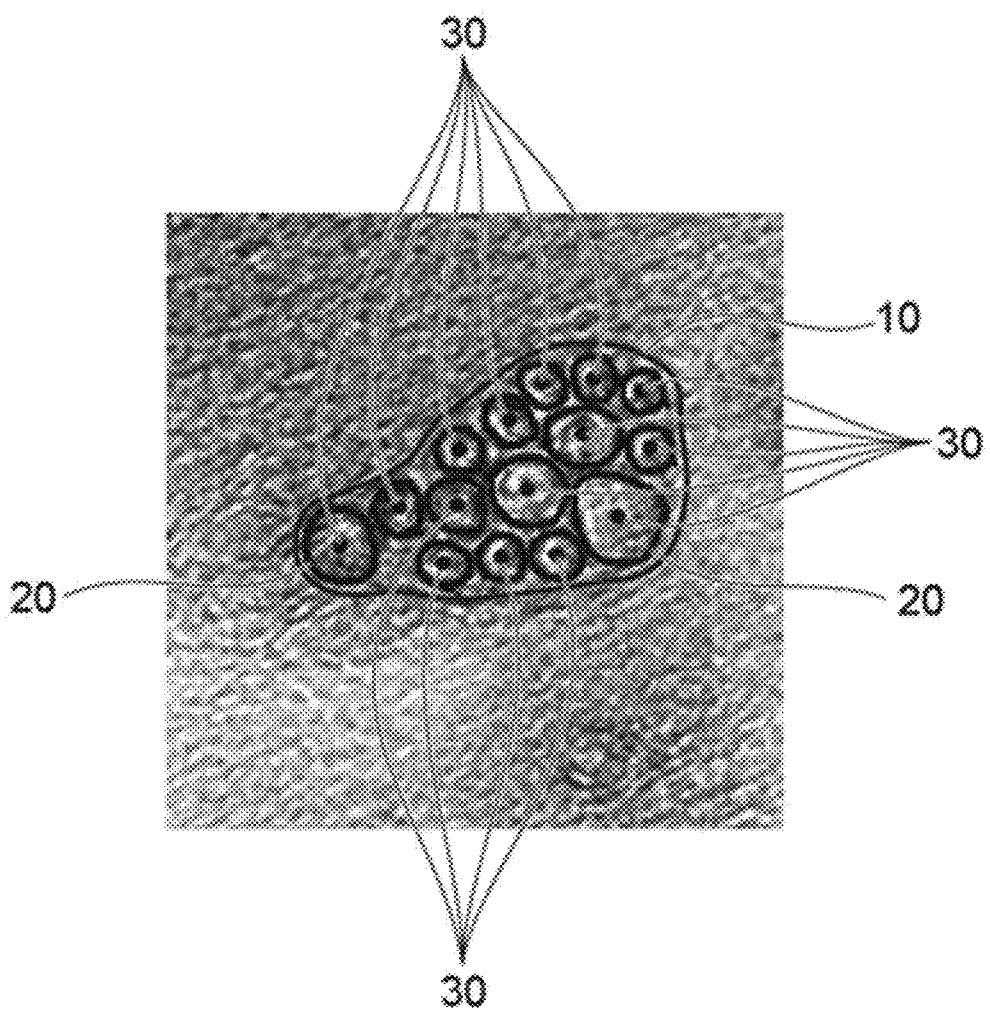
FIG. 2 is a TEM image in which center points are plotted at the center positions of the individual annular outlines of a plurality of CNTs in FIG. 1.
Figure 3:
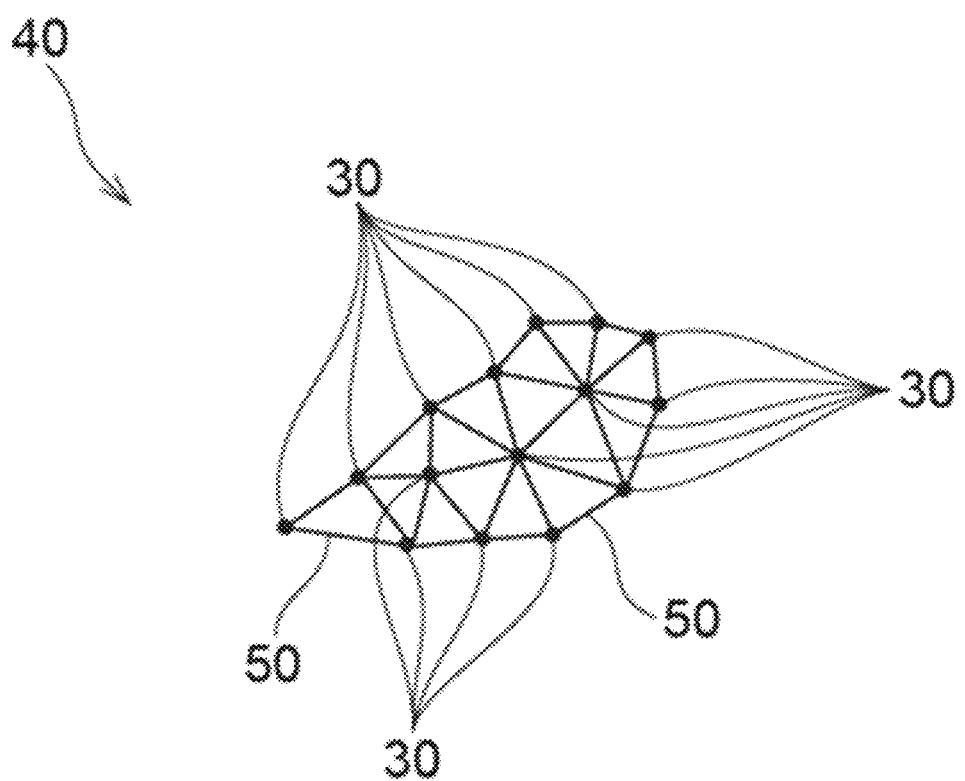
FIG. 3 is a diagram showing a plurality of triangles obtained by connecting the plurality of center points in FIG. 2 with straight lines.
Figure 4:
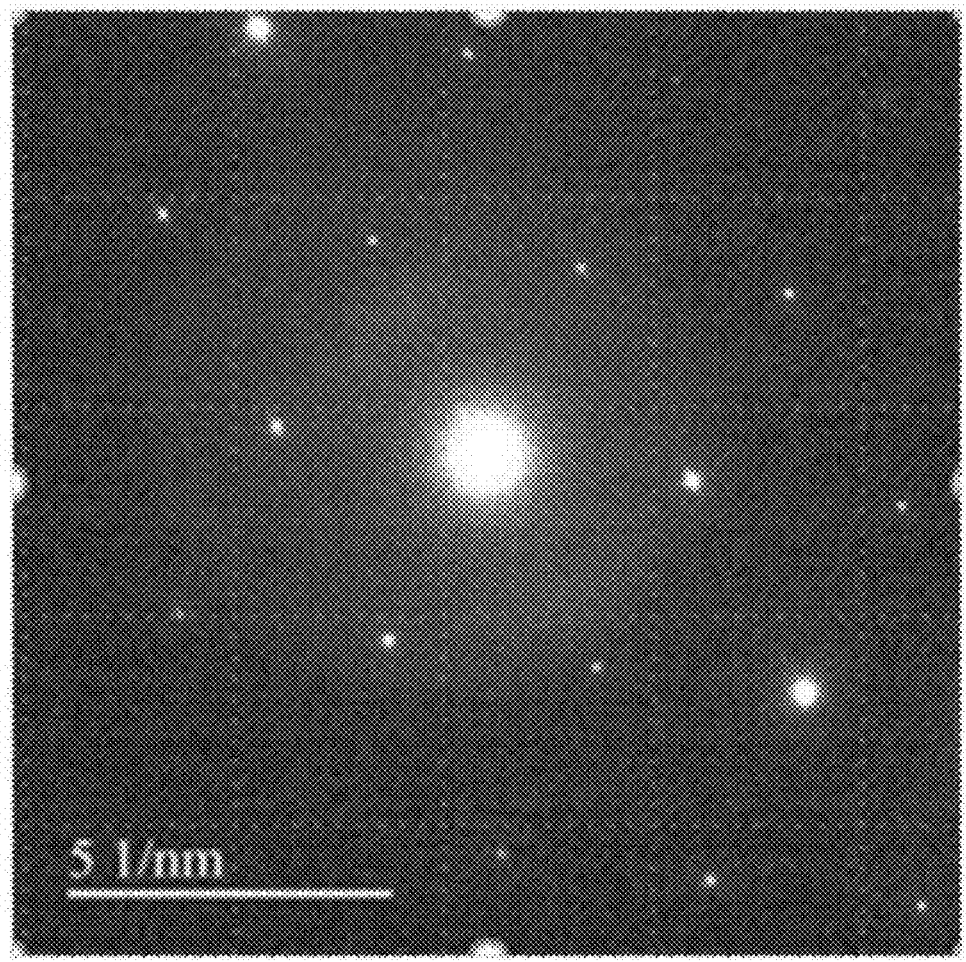
FIG. 4 is a selected area electron beam diffraction image of a cross-section of an example pellicle film.

Next, a method of measuring a packing density parameter of a bundle will be described with reference to FIGS. 1 to 3. In FIG. 2, reference numeral 10 denotes a single bundle, reference numeral 20 denotes an annular outline of CNT, and reference numeral 30 denotes a center point. In FIG. 3, reference numeral 30 denotes a center point, reference numeral 40 denotes a plurality of triangles, and reference numeral 50 denotes a straight line constituting one side of a triangle.

The average value of packing density parameters of a plurality of bundles is measured as follows.

<Transfer>

A self-supporting film portion of a pellicle film of a pellicle, which will be described later, is transferred onto a substrate. The substrate is not particularly limited and may be a silicon substrate. Specifically, a solvent is added dropwise onto the substrate. A pellicle is placed on the substrate such that the pellicle film of the pellicle is opposed to the substrate. Examples of the solvent include water and an organic solvent. The solvent is dried, thereby allowing the pellicle film to be closely attached to the substrate. The substrate is immobilized, and the pellicle frame of the pellicle is lifted, thereby separating the self-supporting film portion from the pellicle to allow the self-supporting film portion to be transferred to the substrate.

<Cross-Sectional Observation>

The transferred self-supporting film portion is cut at two points along the thickness direction of the self-supporting film portion using a focused ion beam device, thereby creating a thin section for cross-sectional observation having a thickness of about 100 nm in the perspective view direction (perpendicular to the cross-section). A cross-section of the self-supporting film portion is observed using a TEM (magnification: from 50,000 to 400,000 times), thereby obtaining a plurality of second TEM images (see FIG. 1). At this time, the self-supporting film portion may be embedded with resin or the like, or a metal or the like may be layered on the self-supporting film portion such that the self-supporting film can be easily contrasted. The resolution of the TEM is preferably such that a length of 5 nm corresponds to 100 pixels or more in the TEM image.

From the plurality of second TEM images, 10 bundles are selected, with which it is easy to recognize the cross-section of one bundle.

Hereinafter, each of the 10 selected bundles is referred to as "single bundle."

<Measurement>

The packing density parameter of each of the 10 single bundles is measured. Specifically, in a 20 nm×20 nm range, including a single bundle of a second TEM image, the center point of the annular outline of each of the plurality of CNTs in the second TEM image is identified (see FIG. 2).

More specifically, as shown in FIG. 1, when a second TEM image of a bundle and CNTs constituting the bundle is observed, the wall portion of a CNT appears as a dark annular line. The annular outline is extracted for the number of CNTs constituting the bundle such that the dark annular line region becomes an outline.

In a second TEM image of a CNT having two or more layers, approximately concentric (or co-centric) annular lines are seen at intervals of from about 0.3 nm to 0.4 nm. Thus, the outline is extracted such that the outermost dark annular region becomes the outline.

After the outline of each of a plurality of CNTs is extracted, the geometric center (centroid) position coordinates of each annular outline are calculated, thereby identifying the center point of the annular outline of each of the plurality of CNTs. A plurality of identified center points is connected by straight lines such that a plurality of triangles satisfying the following conditions (a), (b) and (c) are formed (see FIG. 3). The lengths (distances between center points) of all the plurality of the obtained straight lines are measured:

(a) sides of each of the plurality of triangles do not intersect;
(b) three center points are selected such that a sum of three side lengths of a triangle is minimized;
(c) an interior angle of an outermost triangle among the plurality of triangles is less than 120°.

A plurality of measurement values equal to or less than a predetermined value is identified from the obtained measurement values of the lengths of the straight lines (distances between center points). The predetermined value is obtained by multiplying 1.6 times the average value of the measurement values, starting from the first rank with the shortest length to the predetermined rank in order of the lengths as the measurement values in all the measurement values. The predetermined rank is the same as the integer obtained by rounding off the number obtained by multiplying the total number of the plurality of straight lines by 0.8.

Specifically, as shown in FIG. 3, in a case in which the total number of a plurality of straight line is 27, the predetermined rank is 22 obtained by rounding off 21.6 as a result of multiplying 27 by 0.8. In this case, the predetermined value is obtained by multiplying 1.6 times the average value of the measurement values, starting from the shortest length of the first rank to the 22nd rank in order of the lengths as the measurement values in 27 measurement values.

The standard deviation Sb of distances between center points of a plurality of CNTs constituting a single bundle and the average value Ab of distances between center points of a plurality of CNTs constituting a single bundle are calculated using a plurality of measurement values equal to or less than a predetermined value. The packing density parameter of a single bundle is calculated by Formula (2) using the calculated standard deviation Sb and average value Ab.

Similarly, the packing density parameter of a single bundle is calculated for all 10 single bundles.

The average value of the calculated packing density parameters of 10 single bundles is calculated. The calculated average of the packing density parameters of 10 single bundles is regarded as the average value of packing density parameters of a plurality of bundles.

(1.1.3) Packing Density of Plurality of CNTs Constituting Single Bundle

A method of evaluating the packing density of a plurality of CNTs constituting a single bundle may differ from an evaluation method using the packing density parameter described above.

For example, for a pellicle film consisting of a plurality of CNTs, it is possible to obtain an index regarding the packing of a plurality of CNTs constituting a single bundle from the diffraction intensity information of diffraction peaks using the electron beam diffraction method.

In the eDIPS method, a plurality of CNTs are formed to constitute a bundle. Each of the plurality of CNTs produced by the eDIPS method has a diameter of from about 1.5 nm to 2 nm, and its structure is mainly single-wall or double-wall. For a pellicle film consisting of a plurality of CNTs produced by the eDIPS method, in the selected area electron beam diffraction image of the surface of the pellicle film and the selected area electron beam diffraction image of the cross-section of the pellicle film, a peak derived from a triangular lattice of a single bundle appears near a lattice spacing d=0.40 nm (scattering vector q=2.5 $nm^{-1}$). The cross-section of the pellicle film is a plane obtained by cutting the pellicle film along the thickness direction of the pellicle film.

This diffraction peak reflects the intervals of a plurality of CNTs constituting a single bundle. Therefore, the diffraction intensity depends on the diameter and aggregation state of the CNTs constituting the single bundle. The higher the packing density and the higher the regularity of the packing structure of a plurality of CNTs constituting the single bundle, the stronger the diffraction intensity.

Further, in the case of a thin film having a film thickness of from about 2 nm to 50 nm as with a pellicle film, when observed with a TEM (magnification: from 20,000 to 100,000 times), the number of single bundles and the number of CNTs present in the field of view are small, and the number density of structures that contribute to diffraction is small.

Therefore, to obtain a high diffraction intensity, the plurality of CNTs constituting the single bundle must have a high packing density, and the plurality of CNTs constituting the single bundle must have high regularity.

This diffraction peak reflects the single-bundle-derived lattice (i.e., intervals of a plurality of CNTs constituting a single bundle). Therefore, this diffraction peak appears in a direction perpendicular to the longitudinal direction (axial direction) of the single bundle and CNTs.

By utilizing such diffraction intensity characteristics and evaluating the diffraction intensity derived from a single bundle, it is possible to evaluate the packing density of a plurality of CNTs constituting a single bundle as described in the following (1.1.3.1) and (1.1.3.2).

The lattice spacing d is represented by the reciprocal (1/q) of the scattering vector q.

The scattering vector q is predetermined by the following formula using the distance L from the pellicle film to the detection surface of the detector of the microscope, the wavelength λ of the electron beam, and the distance r from the center of the pellicle film to the diffraction spot.

$$q = \frac{r}{\lambda L}$$

(1.1.3.1) First TEM Diffraction Method (CNT Packing Density)

A method of analyzing a selected area electron beam diffraction image obtained by irradiating an electron beam substantially perpendicularly to the surface and cross-section of the pellicle film will be described below with reference to FIGS. 4 to 7.

Figure 5:
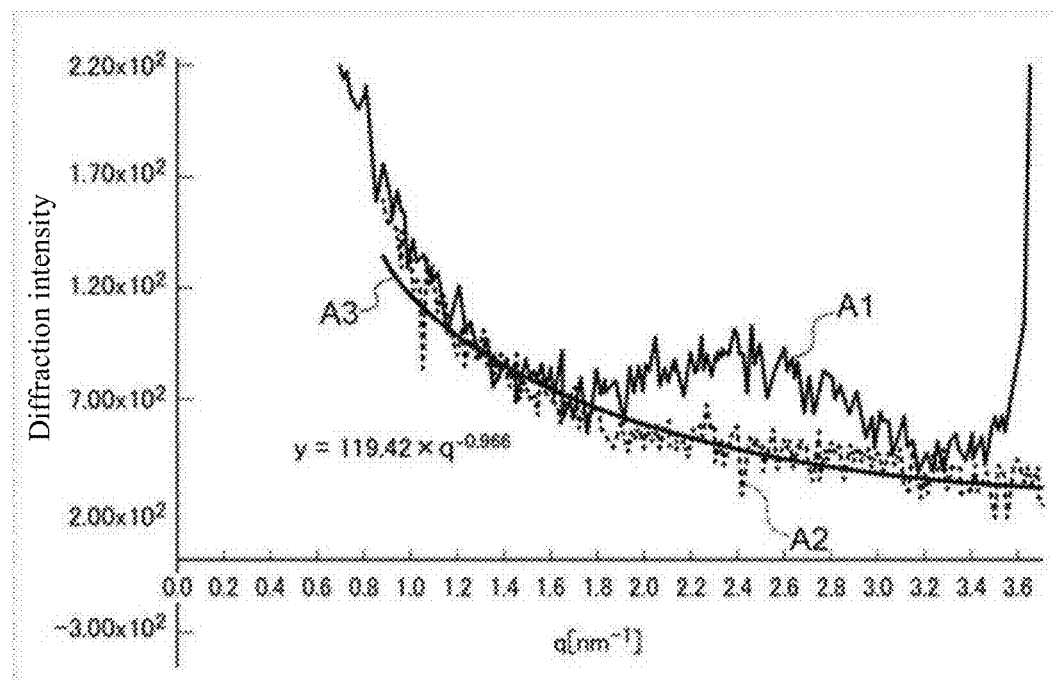
FIG. 5 is a graph plotting the diffraction intensity along each of the film plane direction and the film thickness direction with respect to the scattering vector for the selected area electron beam diffraction image of a cross-section of an example pellicle film (FIG. 4).

In FIG. 5, reference A1 denotes a plotted curve of diffraction intensity along the film thickness direction, reference A2 denotes a plotted curve of diffraction intensity along the film plane direction, and reference A3 denotes an approximate curve. The unit of diffraction intensity in FIG. 5 is the brightness of the 16-bit gradation obtained by a CCD camera, and the same applies to the units of diffraction intensity in FIGS. 6, 7, and 10.

Figure 6:
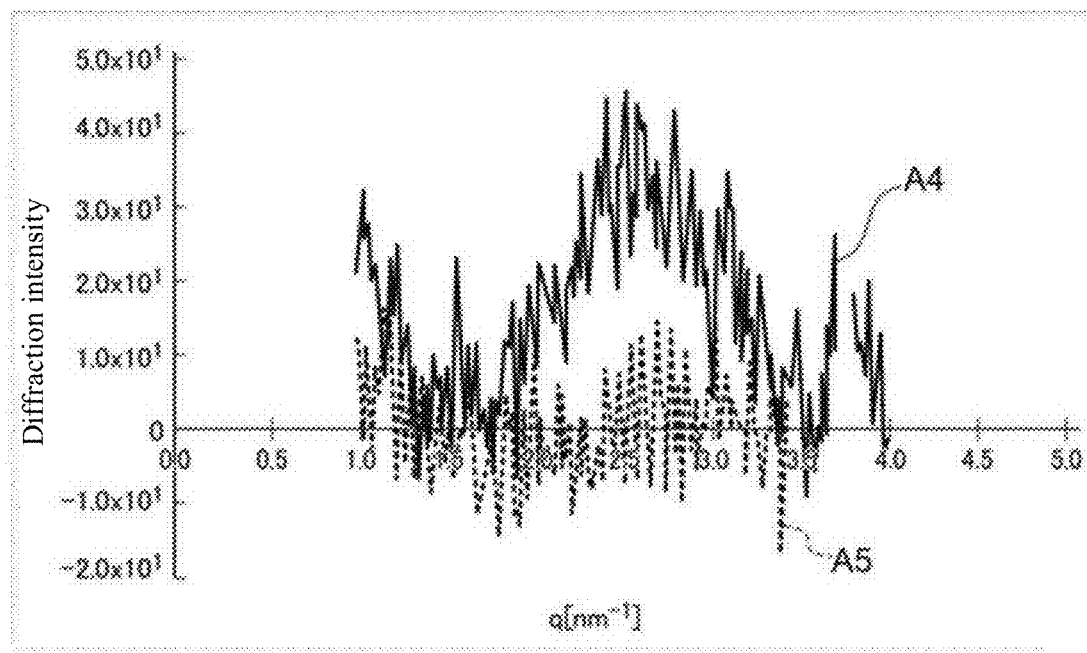
FIG. 6 is a graph showing the difference in diffraction intensity between each of the plotted curves A1 and A2 in FIG. 5 and the approximate curve A3 with respect to the scattering vector.

In FIG. 6, reference numeral A4 denotes a difference curve showing the difference between the plotted curve A1 of the diffraction intensity in the film thickness direction and the approximate curve A3, and reference numeral A5 denotes a difference curve showing the difference between the plotted curve A2 of the diffraction intensity in the film plane direction and the approximate curve A3.

Figure 7:
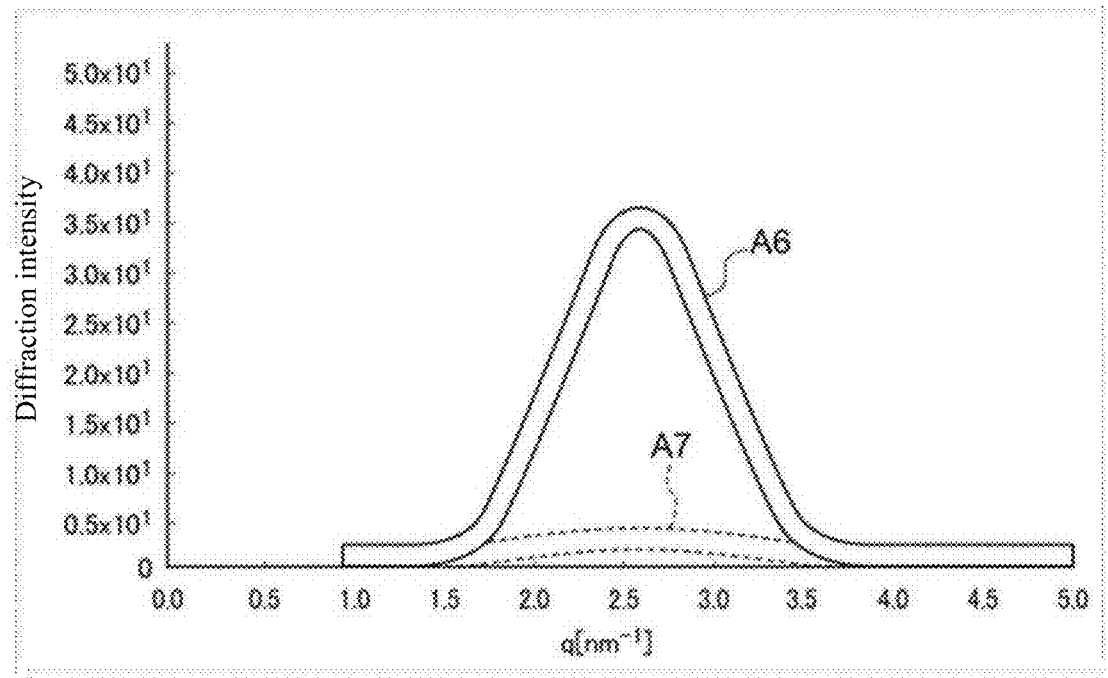
FIG. 7 is a graph showing the diffraction intensity obtained by fitting each of the difference curves A4 and A5 in FIG. 6 with a Gauss function with respect to the scattering vector.

In FIG. 7, reference numeral A6 denotes a fitting function in the film thickness direction, and reference numeral A7 denotes a fitting function in the film plane direction.

First, the self-supporting film portion of the pellicle film is transferred onto the substrate in the same manner as (1.1.2.1) Method of Measuring Packing Density Parameter described above. The transferred self-supporting film portion is cut along the thickness direction of the self-supporting film portion using a focused ion beam device, thereby creating a thin section for cross-sectional observation having a thickness of about 100 nm. A selected area electron beam diffraction image is obtained by irradiating an electron beam almost perpendicularly to the cross-section of the self-supporting film (see FIG. 4). The observation magnification is 30,000 times, and the field-of-view size is set to a range of 30 nm, including the thin film region.

In a case in which the longitudinal direction (axial direction) of the single bundle is horizontal to the surface of the substrate, the longitudinal direction (axial direction) of the single bundle is perpendicular to the film thickness direction. In this case, a peak derived from the single-bundle triangular lattice appears near d=0.40 nm (q=2.5 nm$^{-1}$) in the film thickness direction of the diffraction pattern. Meanwhile, the peak hardly appears in the axial direction (film plane direction) of the single bundle of the diffraction pattern.

Next, the diffraction intensities of diffraction images in the film plane direction and the film thickness direction are plotted against the scattering vector q. Accordingly, a plotted curve of the diffraction intensity in the film thickness direction (see reference numeral A1 in FIG. 5) and a plotted curve of the diffraction intensity in the film plane direction (see reference numeral A2 in FIG. 5) are obtained.

The diffraction intensity derived from the single-bundle triangular lattice does not appear in the film plane direction (see reference numeral A2 in FIG. 5). An approximate curve denoted by reference numeral A3 in FIG. 5 is created such that the diffraction spectrum in the film plane direction becomes the baseline. As the approximate curve, a function in which the diffraction intensity monotonously decreases as the value of q increases in a range of q=from 1.0 nm$^{-1}$ to 4.0 nm$^{-1}$ may be used.

Although the type of approximate curve of the diffraction profile is not particularly limited, it is preferable to use a specific power function. For a particular power function, the slope (decrease rate) of the diffraction intensity curve increases as the value of q decreases and decreases as the value of q increases. The power function can be, for example, y=αq$^{-β}$ (α and β are appropriate positive values), where y is a diffraction intensity and q [nm$^{-1}$] is a scattering vector. Specifically, in FIG. 5, the approximate curve A3 is y=119.42×q$^{-0.966}$.

Next, a difference between the approximate curve and each of the diffraction profile of the pellicle film in the film thickness direction and the diffraction profile of the pellicle film in the film plane direction is obtained in a range of q=from 1.0 nm$^{-1}$ to 4.0 nm$^{-1}$. Accordingly, a difference curve in the film thickness direction (see reference numeral A4 in FIG. 6) and a difference curve in the film plane direction (see reference numeral A5 in FIG. 6) are obtained.

The difference curve in the film thickness direction is calculated by, for example, subtracting the approximate curve from the plotted curve of the diffraction intensity in the film thickness direction.

The difference curve in the film plane direction is calculated by, for example, subtracting the approximate curve from the plotted curve of the diffraction intensity in the film plane direction.

A Gauss function is used to fit peaks appearing in a range of q=from 1.0 nm$^{-1}$ to 4.0 nm$^{-1}$ for each of the diffraction intensity in the film thickness direction and the diffraction intensity in the film plane direction, the difference curve in the film thickness direction, and the difference curve in the film plane direction.

Examples of a fitting method using a Gauss function include a nonlinear least-squares method.

In a sample using a silicon wafer as a substrate for transferring the self-supporting film portion, a diffraction peak derived from the silicon wafer appears near q=3.7 nm$^{-1}$ in the diffraction plot in the film thickness direction. Therefore, fitting is performed with one Gauss function for this peak derived from the silicon wafer. In other words, a diffraction peak (q=from 2.0 nm$^{-1}$ to 3.0 nm$^{-1}$) derived from a single bundle in the diffraction plot in the film thickness direction is extracted by fitting with a Gauss function. Accordingly, a fitting function in the film thickness direction (see reference numeral A6 in FIG. 7) and a fitting function in the film plane direction (see reference numeral A7 in FIG. 7) are obtained.

The diffraction peak ratio (hereinafter also referred to as "first diffraction peak ratio") is preferably 2 or more, more preferably 5 or more, still more preferably 10 or more.

The "first diffraction peak ratio" refers to the ratio of the local maximum value of the fitting function in the film thickness direction to the local maximum value of the fitting function in the film plane direction in a range of q=from 2.0 $nm^{-1}$ to 3.0 $nm^{-1}$.

The higher the value of this first diffraction peak ratio, the denser the packing density of a plurality of CNTs constituting a single bundle and the fewer gaps. Therefore, as long as the first diffraction peak ratio is within the above-described numerical range, the diffusion of hydrogen radicals into the single bundle is further suppressed. As a result, the pellicle film exhibits higher lifetime characteristics and is unlikely to experience film reduction even when exposed to hydrogen plasma.

(1.1.3.2) Second TEM Diffraction Method (CNT Packing Density)

Next, a method of analyzing an electron beam diffraction image obtained by irradiating an electron beam to the surface of a thin section of the pellicle film for surface observation will be described below with reference to FIGS. 8 to 10.

Figure 8:
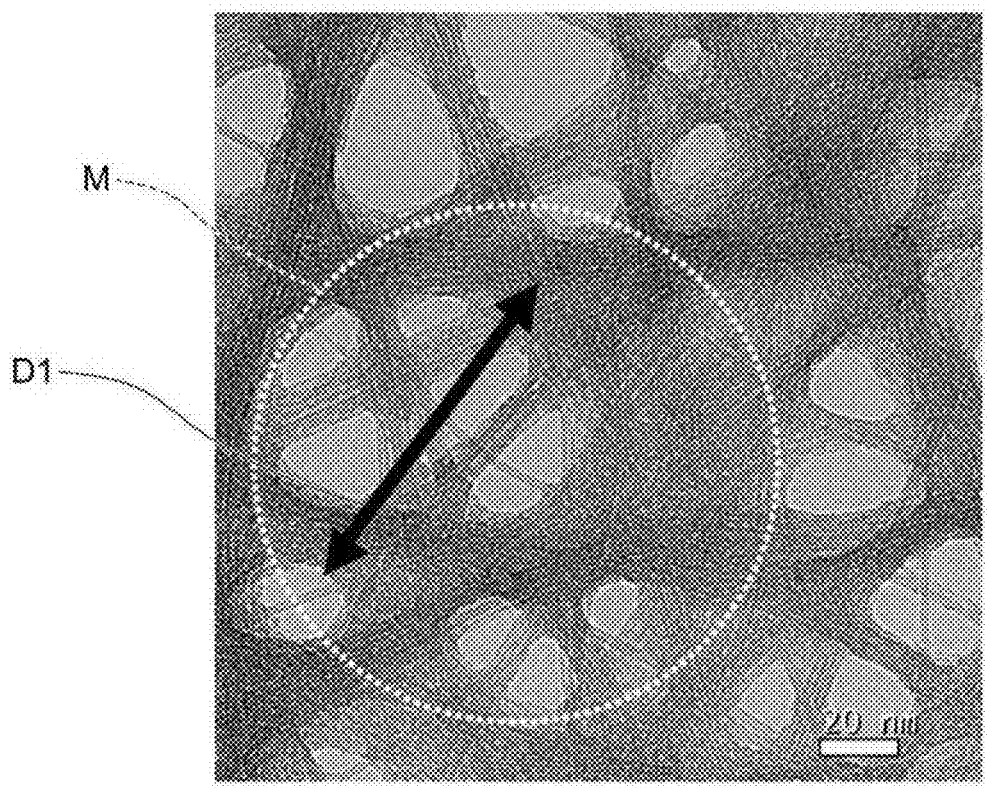
FIG. 8 is a TEM image of the surface of an example pellicle film.

In FIG. 8, reference numeral M denotes an example of an electron diffraction measurement region, and reference numeral D1 denotes a longitudinal direction (axial direction) of one single bundle located in the measurement region M.

Figure 9:
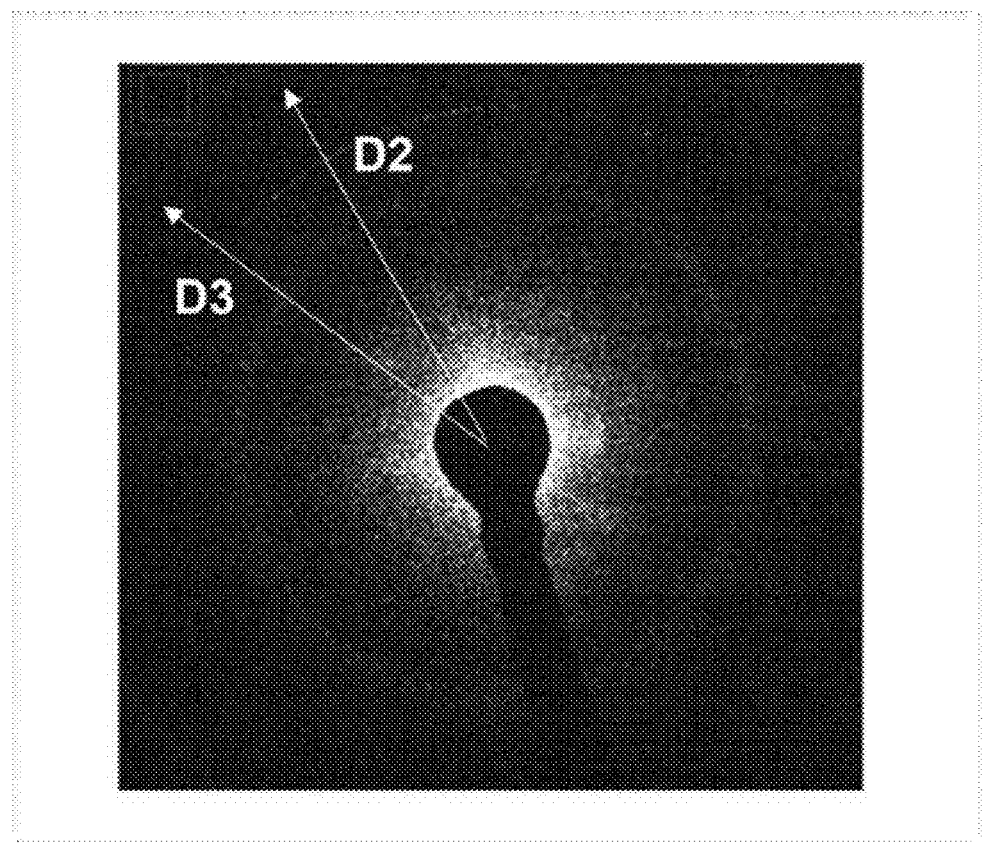
FIG. 9 is a selected area diffraction image of a TEM image of the surface of an example pellicle film.

In FIG. 9, reference numeral D2 denotes a direction in which the diffraction intensity derived from the triangular lattice of a single bundle is weak (hereinafter also referred to as a "low diffraction intensity direction"), and reference numeral D3 denotes a direction in which the diffraction intensity derived from the triangular lattice of a single bundle is strong (hereinafter also referred to as a "high diffraction intensity direction").

Figure 10:
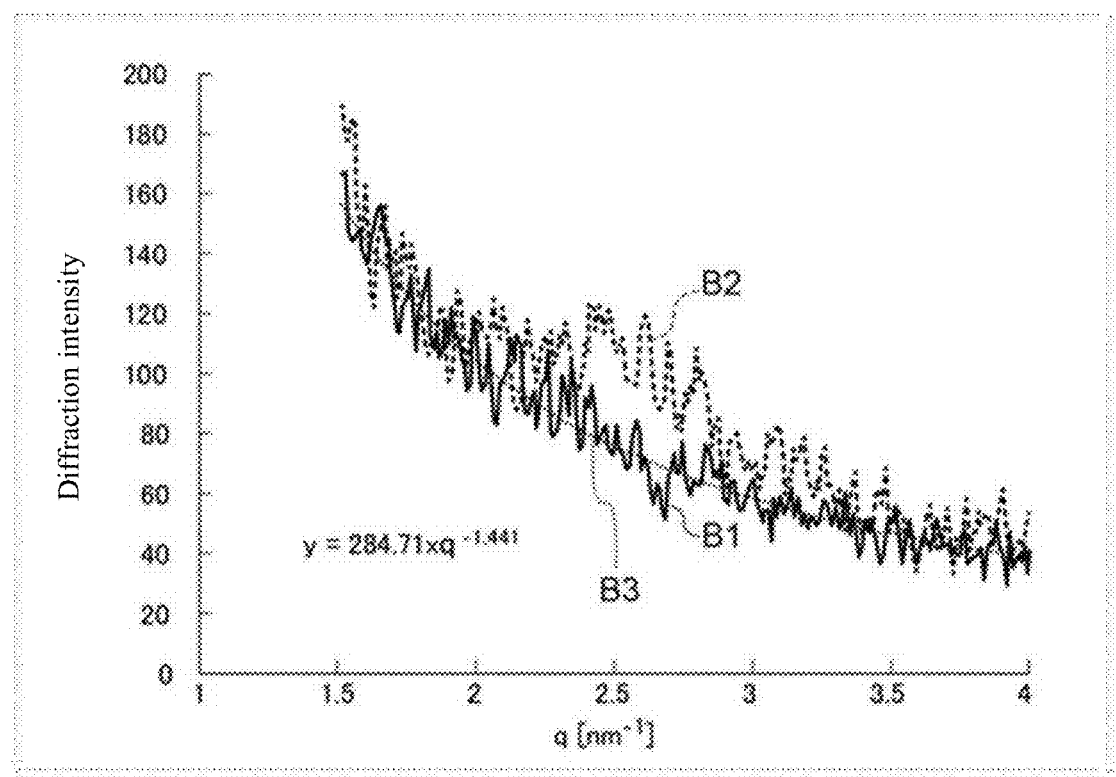
FIG. 10 is a graph showing the diffraction intensities of diffraction images in the respective directions D2 and D3 in FIG. 9 with respect to the scattering vector of an example pellicle film.

In FIG. 10, reference numeral B1 denotes a plotted curve of the diffraction intensity of a diffraction image in the low diffraction intensity direction, and reference numeral B2 denotes a plotted curve of the diffraction intensity of a diffraction image in the high diffraction intensity direction. Reference numeral B3 denotes an approximate curve.

The pellicle film according to the first embodiment preferably includes a plurality of carbon nanotubes forming a bundle and has a diffraction peak ratio (hereinafter also referred to as "second diffraction peak ratio") of 1.3 or more.

The diffraction peak ratio indicates a ratio of a peak of a second Gauss function that is an element of a second fitting function obtained by fitting a second plotted curve to a peak of a first Gauss function that is an element of a first fitting function obtained by fitting a first plotted curve in a selected area diffraction image of a surface of the pellicle film observed with a transmission electron microscope. In other words, the diffraction peak ratio indicates (peak of the second Gauss function obtained by fitting the second plotted curve)/(peak of the first Gauss function obtained by fitting the first plotted curve).

The first plotted curve is a diffraction intensity profile in a direction in which a diffraction intensity from a bundle lattice of a bundle is weak with respect to the scattering vector q.

The second plotted curve is a diffraction intensity profile in a direction in which the diffraction intensity is strong with respect to the scattering vector q.

The first fitting function creates a curve represented by a sum of a baseline function common to the first plotted curve and the second plotted curve when the scattering vector q is in a range of q=from 1.5 $nm^{-1}$ to 4.0 $nm^{-1}$ and the first Gauss function in which a peak center position of the first plotted curve is in a range of q=from 2.0 $nm^{-1}$ to 3.0 $nm^{-1}$. In other words, the first fitting function creates an approximate curve of the first plotted curve.

The first Gauss function can be derived by fitting with a Gauss function whose peak center position is in a range of q=from 2.0 $nm^{-1}$ to 3.0 $nm^{-1}$ from the difference between the first plotted curve and the baseline function. Although the fitting method is not limited, for example, the least squares method can be used.

The second fitting function creates a curve represented by a sum of the baseline function and the second Gauss function in which a peak center position of the second plotted curve is in a range of q=from 2.0 $nm^{-1}$ to 3.0 $nm^{-1}$.

The second Gauss function can be derived by fitting with a Gauss function whose peak center position is in a range of q=from 2.0 $nm^{-1}$ to 3.0 $nm^{-1}$ from the difference between the second plotted curve and the baseline function. Although the fitting method is not limited, for example, the least squares method can be used.

The peak of the first Gauss function indicates a local maximum value of the first Gauss function when the scattering vector q is in a range of q=from 2.0 $nm^{-1}$ to 3.0 $nm^{-1}$.

The peak of the second Gauss function indicates a local maximum value of the second Gauss function when the scattering vector q is in a range of q=from 2.0 $nm^{-1}$ to 3.0 $nm^{-1}$.

Hereinafter, the "baseline function common to the first plotted curve and the second plotted curve when the scattering vector q is in a range of q=from 1.5 $nm^{-1}$ to 4.0 $nm^{-1}$" may be simply referred to as "baseline function."

A higher value of the second diffraction peak ratio means that the packing density of a plurality of CNTs constituting a bundle is higher (i.e., the gap between adjacent CNTs is smaller).

As long as the second diffraction peak ratio is within the above-described range, the diffusion of hydrogen radicals into the bundle is further suppressed. As a result, the pellicle film exhibits higher lifetime characteristics and is unlikely to experience film reduction even when exposed to hydrogen plasma.

A method of measuring a second diffraction peak ratio will be described below.

First, the self-supporting film portion of the pellicle film is transferred to a grid for electron microscope observation as (1.1.1.1) Method of Measuring Linearity Parameter described above. The surface of the transferred self-supporting film portion is observed using a TEM (magnification: from 20,000 times to 100,000 times) in the direction along the film thickness direction of the self-supporting film portion, thereby determining the measurement site for electron beam diffraction (See FIG. 8). The measurement region is irradiated with an electron beam substantially perpendicular to the film plane direction, and a selected area diffraction image having a field-of-view size of from 50 nm to 120 nm is obtained when observed at a magnification of 100,000.

In the obtained diffraction image, a peak derived from the single-bundle triangular lattice appears near d=0.40 nm (q=2.5 $nm^{-1}$) in the direction perpendicular to the longitudinal direction (axial direction) of the single bundle existing inside the region in which the diffraction was measured.

Regarding the diffraction intensity of the diffraction image, the diffraction intensity in each of the low diffraction intensity direction (see reference numeral D2 in FIG. 9) and the high diffraction intensity direction (see reference numeral D3 in FIG. 9) with respect to the scattering vector q is plotted (see FIG. 10). Accordingly, a first plotted curve in the low diffraction intensity direction and a second plotted curve in the high diffraction intensity direction are obtained.

The high diffraction intensity direction can be judged from the appearance of a bright line/bright spot at d=0.40 nm (q=2.5 nm$^{-1}$) of the selected area diffraction image in the direction perpendicular to the longitudinal direction (axial direction) of the bundle within the range in which the diffraction image of the electron beam transmission image was obtained.

The low diffraction intensity direction can be judged from the appearance of a dark region in the selected area diffraction image in the direction perpendicular to the axial direction in which the bundle does not extend within the range in which the diffraction image of the electron beam transmission image was obtained.

The first plotted curve is a diffraction intensity profile in the low diffraction intensity direction with respect to the scattering vector q. The second plotted curve is a diffraction intensity profile in the high diffraction intensity direction with respect to the scattering vector q.

Each of the first plotted curve (see reference numeral B1 in FIG. 10) and the second plotted curve (see reference numeral B2 in FIG. 10) is fitted to a Gauss function using the difference between the first plotted curve and the baseline function and the difference between the second plotted curve and the baseline function. Accordingly, a first Gauss function in the low diffraction intensity direction and a second Gauss function in the high diffraction intensity direction are obtained.

The thus obtained first Gauss function and second Gauss function are used to obtain a second diffraction peak ratio such that it is possible to easily evaluate whether or not a plurality of CNTs constituting a single bundle are in a dense state, i.e., whether or not the pellicle film is unlikely to experience film reduction even when exposed to hydrogen plasma.

The first fitting function is represented by the sum of the baseline function and the first Gauss function.

The second fitting function is represented by the sum of the baseline function and the second Gauss function.

The baseline function of the first fitting function and that of the second fitting function are the same.

The baseline function is a function common to the first plotted curve B1 and the second plotted curve B2, which is preferably a function in which the diffraction intensity monotonously decreases as the value of q increases in a range of q=from 1.5 nm$^{-1}$ to 4.0 nm$^{-1}$. It is more preferable to use, as the baseline function, a power function in which the slope (decrease rate) of the diffraction intensity curve increases when the value of q decreases, and the slope (rate of decrease) of the diffraction intensity curve decreases as the value of q increases. The power function can be, for example, y=αq$^{-\beta}$ (α and β are appropriate positive values), where y is a diffraction intensity and q is a scattering vector. Specifically, in FIG. 10, the approximate curve B3 is y=284.71×q$^{-1.411}$.

The first Gauss function is represented by, for example, the following Formula [math 2]. In the following Formula [math 2], $a_1$ represents the diffraction peak intensity, $b_1$ represents the peak position, and $c_1$ represents the peak width.

$$F1 = a_1 \exp\left\{-\frac{(q-b_1)^2}{2c_1^2}\right\}$$

The second Gauss function is represented by, for example, the following Formula [math 3]. In the following Formula [math 3], $a_2$ represents the diffraction peak intensity, $b_2$ represents the peak position, and $c_2$ represents the peak width.

$$F2 = a_2 \exp\left\{-\frac{(q-b_2)^2}{2c_2^2}\right\}$$

The first Gauss function is set to approximate the difference between the first plotted curve and the baseline function. Specifically, assuming that the first fitting function is Z1, the baseline function is Y, and the first Gauss function is F1, for example, the first fitting function is represented by Z1=Y+F1. The first fitting function approximates the first plotted curve.

The second Gauss function is set to approximate the difference between the second plotted curve and the baseline function. Specifically, assuming that the second fitting function is Z2, the baseline function is Y, and the second Gauss function is F2, for example, the second fitting function is represented by Z2=Y+F2. The second fitting function approximates the second plotted curve.

The second diffraction peak ratio is preferably 1.3 or more, more preferably 1.5 or more, still more preferably 2 or more, yet still more preferably 5 or more.

The upper limit of the second diffraction peak ratio is not particularly limited and can be, for example, 100 or less, 50 or less, or 20 or less.

From these viewpoints, the second diffraction peak ratio is preferably from 1.3 to 100, more preferably from 1.5 to 100, still more preferably from 1.5 to 50, particularly preferably from 1.5 to 20, further preferably from 2 to 20, still further preferably from 5 to 20.

(1.1.4) Smoothness Evaluation Value (linearity of CNT)

Figure 11:
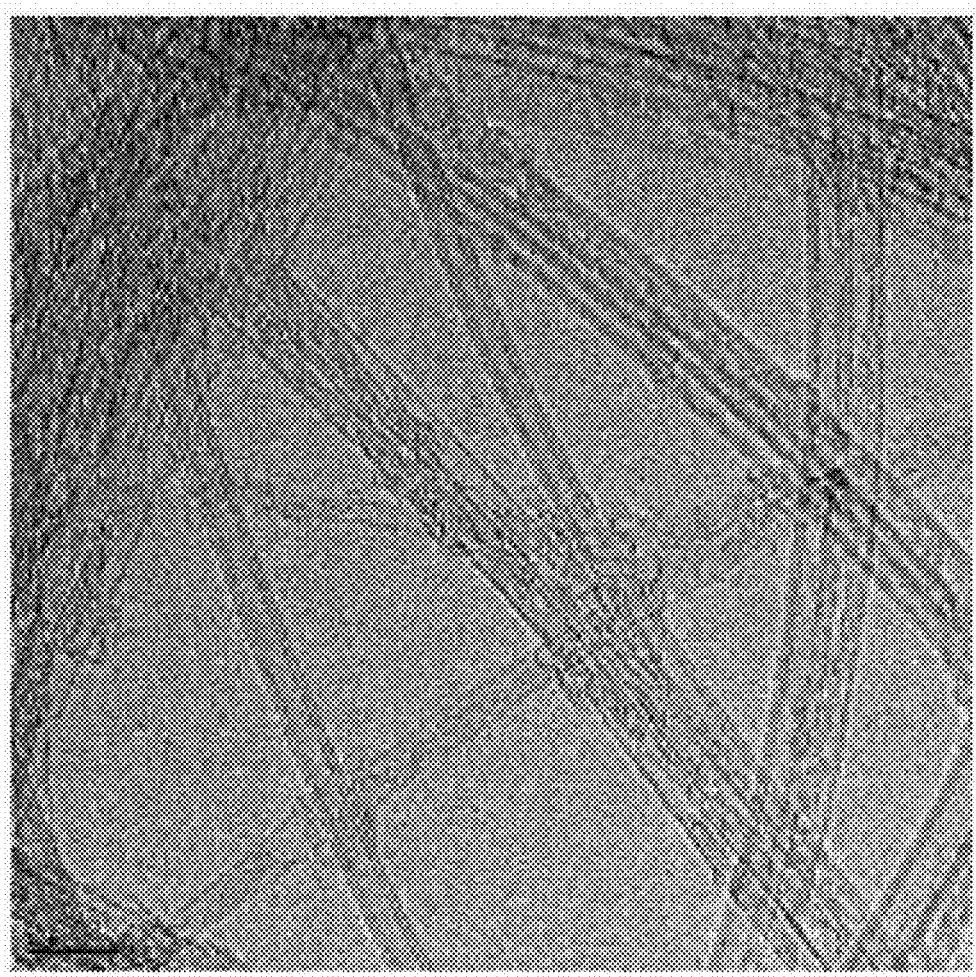
FIG. 11 is a TEM image of the surface of an example pellicle film.

Next, as a method of quantitatively determining the linearity of CNT, a method using the smoothness evaluation value will be described with reference to FIGS. 11 to 13.

Figure 12:
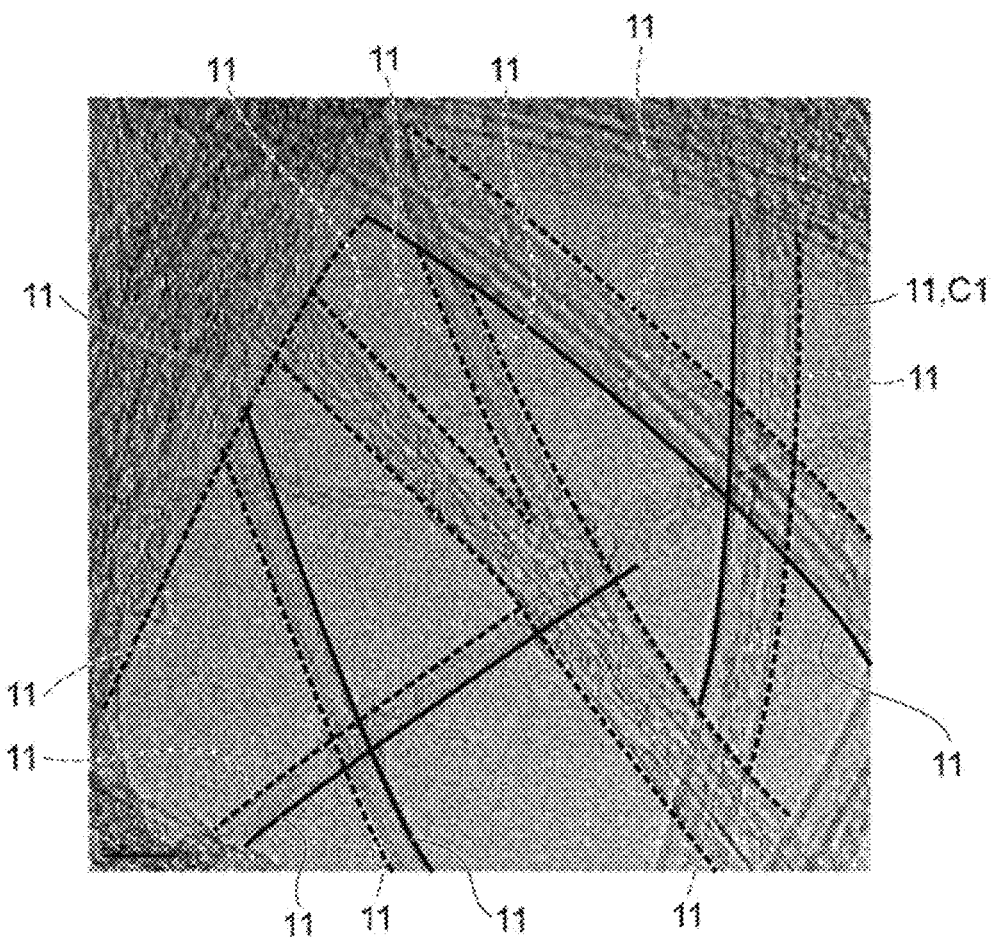
FIG. 12 is a TEM image in which the outlines of a plurality of CNTs in FIG. 11 are drawn individually.

In FIG. 12, reference numeral 11 denotes an outline of CNT.

Figure 13:
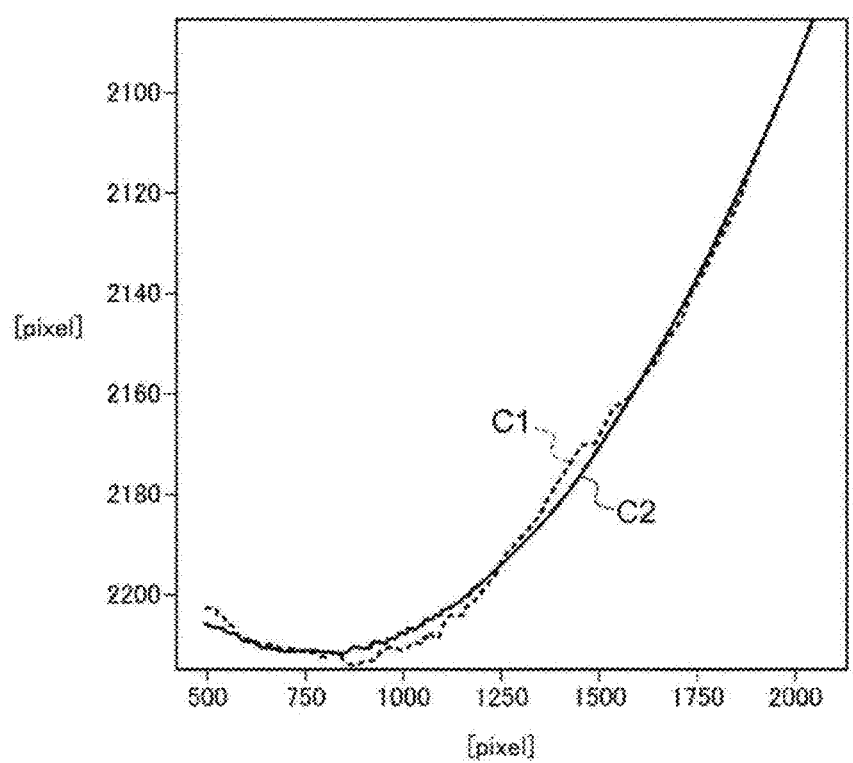
FIG. 13 is a diagram in which an approximate curve is drawn for the outline C1 of CNT in FIG. 12.

In FIG. 13, reference numeral C1 denotes a CNT outline, and reference numeral C2 denotes an approximate curve.

It is preferable that the pellicle film according to the first embodiment includes a plurality of carbon nanotubes forming a bundle and has a smoothness evaluation value of 0.070 (nm$^2$/nm) or less.

The smoothness evaluation value indicates a value obtained by dividing an area between an outline of a carbon nanotube and an approximate curve of the outline by a length of the approximate curve.

The outline is a line obtained by tracing a wall portion of a carbon nanotube (CNT) that appears as a dark line in a transmission electron microscope image of a surface of the pellicle film at a resolution of 100 pixels or more with a length of 5 nm.

The approximate curve is a curve drawn by quadratic spline interpolation of coordinates of the outline of the CNT.

The outline and the approximate curve of the carbon nanotube are extracted from 20 carbon nanotubes.

The length of the outline per carbon nanotube is 20 nm.

As long as the smoothness evaluation value is within the above-described range, the defect density of each CNT structure is low. Therefore, the number of non-linear portions that serve as starting points for etching with hydrogen plasma is small. The distances between center points of a plurality of CNTs constituting a single bundle are short, and the plurality of CNTs constitutes a single bundle. Further, the high linearity allows the CNT chains to be adjacent to each other with small gaps. Therefore, the packing density of CNTs inside the single bundle is increased. Even when the pellicle film is exposed to hydrogen plasma, the film reduction of the pellicle film can be suppressed.

The method using the smoothness evaluation value uses a transmission electron microscope image (see FIG. 11) obtained by observing the pellicle film from the film plane direction. The method using the smoothness evaluation value includes an extraction step, an approximate curve creation step, an area between curves calculation step, and a calculation step, which are carried out in that order.

In the extraction step, a CNT outline is extracted (see FIG. 12).

In the approximate curve creation step, an approximate curve is created for the CNT outline (see FIG. 13).

In the area between curves calculation step, the area between the approximate curve and the CNT outline is calculated. The "area between the approximate curve and the CNT outline" indicates a total area of a plurality of portions surrounded by the approximate curve and the CNT outline.

In the calculation step, the CNT smoothness evaluation value is calculated by dividing the area calculated in the area between curves calculation step by the length of the approximate curve (i.e., normalizing the area between curves).

(1.1.4.1) Extraction Step

Specifically, first, the self-supporting film portion of the pellicle film is transferred to a grid for electron microscope observation as (1.1.1.1) Method of Measuring Linearity Parameter described above. The surface of the self-supporting film is irradiated with an electron beam substantially perpendicularly to the film plane direction. The surface of the self-supporting film is observed from the thickness direction of the self-supporting film at a resolution of 100 pixels or more with a length of 5 nm and a magnification of from 100,000 to 600,000 times, thereby obtaining a plurality of third TEM images (see FIG. 11).

From a plurality of third TEM images, 20 CNTs, from which the outline derived from one CNT can be clearly recognized, are selected.

In a third TEM image, the wall portion of a CNT appears as a dark line. By tracing this dark portion, it is possible to extract the "CNT outline" in the extraction step.

In a third TEM image, two outlines can usually be observed from one CNT. Four outlines are observed from two-layer CNTs, and 2n outlines are observed from n-layer CNTs. n is a natural number. In a case in which the selected CNTs are two or more-layer CNTs, the outermost outline of the CNT is extracted as the "CNT outline" in the extraction step.

The "CNT outline" of each of the selected 20 CNTs is extracted.

(1.1.4.2) Approximate Curve Creation Step

For each of the 20 selected CNTs, the outline coordinates of the "CNT outline" on one side of the two are obtained. The length of the outline to be drawn for each CNT is 20 nm (see FIG. 12). The "length of the outline to be drawn" indicates the distance of a straight line connecting the start point of the outline and the end point of the outline.

Accordingly, the CNT outline with the number of pixels on the horizontal and vertical axes is created (see reference numeral C1 in FIG. 13). The reference numeral "C1" in FIG. 13 denotes an outline drawn by the method described above for the CNT outline C1 in FIG. 12. In FIG. 13, the horizontal and vertical axes indicate the number of pixels.

An approximate curve is created from the coordinates of the CNT outline by spline interpolation (see reference numeral C2 in FIG. 13). At this time, an approximate curve is created such that the average value of the difference between the approximate curve and the CNT outline per unit length (=1 nm) is equal to or not more than 0.2 [nm]. The order of spline interpolation may be any order as long as it satisfies the above-described conditions, but it is preferably quadratic spline interpolation or cubic spline interpolation, more preferably quadratic spline interpolation.

The "difference between the approximate curve and the CNT outline" concerns the points on the CNT outline and the approximate curve at a certain point X on the horizontal axis and refers to the difference in the value on the vertical axis between the point on the CNT outline and the point on the approximate curve at the same point X on the horizontal axis. The average value of the difference indicates the average value of the distance in a predetermined range (1 nm length of the outline) on the horizontal axis.

(1.1.4.3) Area Between Curves Calculation Step

The area [nm$^2$] between the approximate curve and the CNT outline is calculated. A method of calculating the area [nm$^2$] between the approximate curve and the CNT outline is not particularly limited as long as it is a known method. For example, commercially available software may be used.

(1.1.4.4) Calculation Step

The length of the approximate curve [nm] is calculated. In an example shown in FIG. 13, the length of the approximate curve is equivalent to the length of approximate curve C2 of a pixel corresponding to a length of 20 nm of the extracted CNT outline. Specifically, in FIG. 13, the length of the approximate curve is the length from one end at 500 pixels on the horizontal axis and 2207 pixels on the vertical axis to the other end at 2010 pixels on the horizontal axis and 2085 pixels on the vertical axis of the approximate curve.

The area between the approximate curve and the outline per unit length of one outline [nm$^2$/nm] (hereinafter also referred to as "area per unit length") is calculated by dividing the area between the approximated curve and the outline [nm$^2$] by the length of the approximated curve [nm].

The area per unit length [nm$^2$/nm] is calculated for each of the 20 outlines. Then, an average value of the calculated area [nm] per unit length is obtained. The average value of the area per unit length for 20 outlines is used as the smoothness evaluation value.

The smoothness evaluation value is preferably 0.070 [nm$^2$/nm] or less, more preferably 0.050 [nm$^2$/nm] or less, still more preferably 0.036 [nm$^2$/nm] or less, yet still more preferably 0.034 [nm$^2$/nm] or less. The closer the smoothness evaluation value to 0 [nm$^2$/nm], the higher the CNT linearity.

The lower limit of the smoothness evaluation value is not particularly limited and can be, for example, 0.001 (nm$^2$/nm) or more, 0.005 (nm$^2$/nm) or more, or 0.010 (nm$^2$/nm) or more.

From these viewpoints, the smoothness evaluation value is preferably from 0 (nm$^2$/nm) to 0.070 (nm$^2$/nm), more preferably from 0 (nm$^2$/nm) to 0.050 (nm$^2$/nm), still more preferably from 0 (nm$^2$/nm) to 0.036 (nm$^2$/nm), yet still more preferably from 0.001 (nm$^2$/nm) to 0.036 (nm$^2$/nm), even still more preferably from 0.005 (nm$^2$/nm) to 0.036

(nm²/nm), particularly preferably from 0.010 (nm²/nm) to 0.036 (nm²/nm), further preferably from 0.010 (nm²/nm) to 0.034 (nm²/nm).

The above-described steps of extracting an outline coordinate, measuring an approximate curve length, calculating an area between an approximate curve and a CNT outline, and the like may be performed pixel by pixel with one pixel of the image as the minimum unit. Then, lastly, the length per pixel from the magnification and scale of the image may be converted.

(1.1.5) Average Gap Area Proportion (CNT packing density)

Next, as a method for calculating the packing density parameters of a plurality of bundles, a method (hereinafter referred to as a "second method") using the area obtained by image analysis of a TEM image of a cross-section of a pellicle film will be described with reference to FIGS. 14 to 19.

Figure 15:
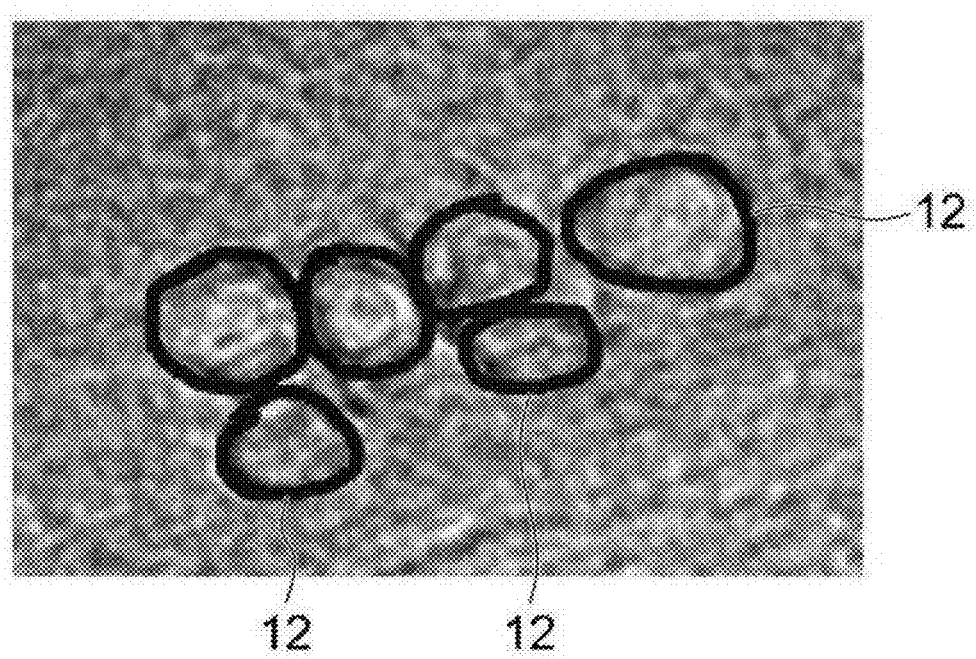
FIG. 15 is a TEM image in which annular outlines are drawn respectively for a plurality of CNTs in FIG. 14.

In FIG. 15, reference numeral 12 denotes an outline of CNT.

Figure 16:
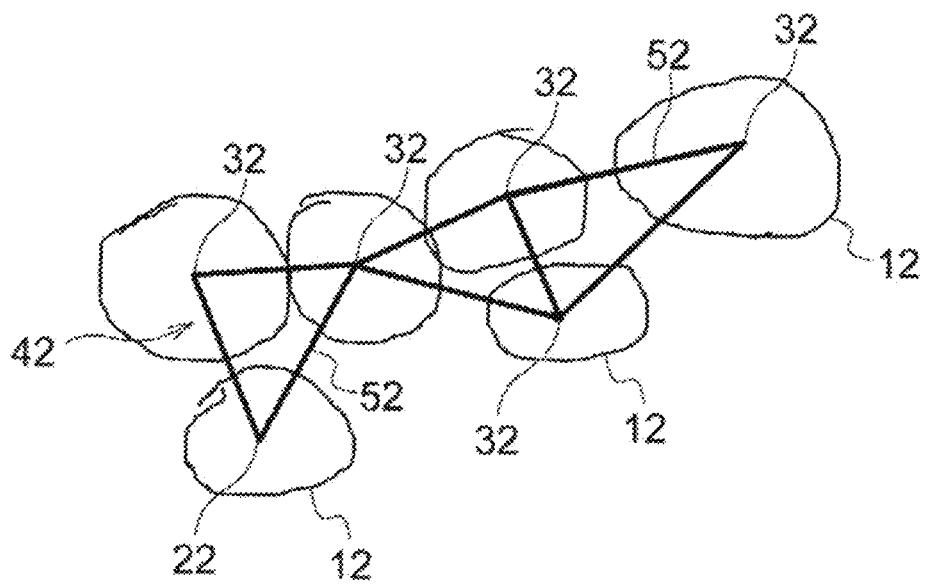
FIG. 16 is a diagram showing a polygon obtained by connecting the center points of the plurality of annular outlines in FIG. 15 with straight lines.

In FIG. 16, reference numeral 12 denotes an outline of CNT, reference numeral 32 denotes a center point of an annular outline, reference numeral 42 denotes a polygon, and reference numeral 52 denotes a straight line constituting one side of the polygon.

Figure 18:
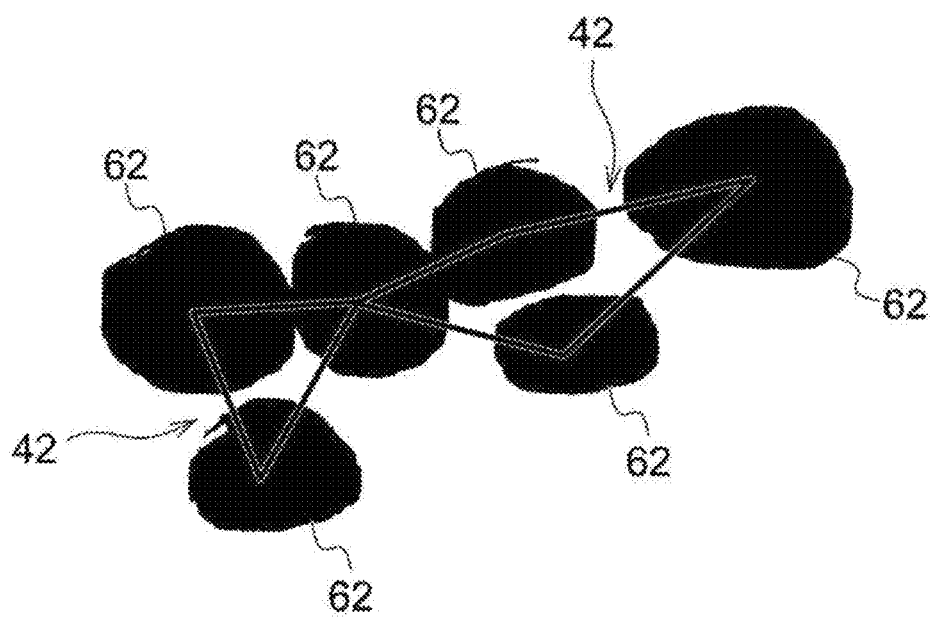
FIG. 18 is a diagram showing the polygon in FIG. 16, in which the insides of the plurality of annular outlines are filled with black.
Figure 19:
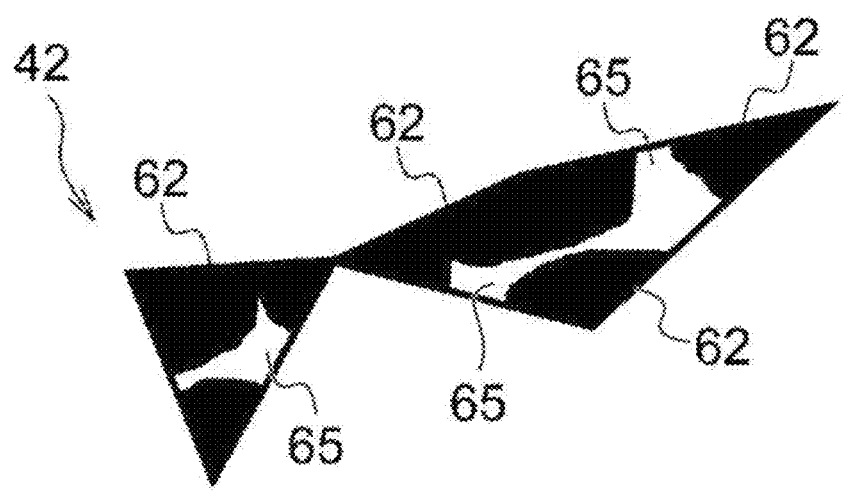
FIG. 19 is a diagram showing the polygon in FIG. 18, in which cross-sections of CNTs located outside the polygon are deleted from among the cross-sections of the plurality of CNTs.

In FIG. 18, reference numeral 62 denotes a cross-section of CNT. Reference numeral 65 denotes a gap between cross-sections 62 of adjacent CNTs inside the polygon 42.

The second method uses a cross-sectional image of CNT. The second method includes an extraction step, a center point acquisition step, a first calculation step, a second calculation step, and a third calculation step carried out in that order.

In the extraction step, a CNT outline is extracted from a cross-sectional image of CNT.

In the center point acquisition step, the center point coordinates are acquired by calculating the geometric center of the outline of the cross-section of CNT.

In the first calculation step, a polygon is created using the center point coordinates and the area of the polygon (TA) is calculated.

In the second calculation step, the total area (TB) of the region inside the outline of the cross-section of CNT in the polygon is calculated.

In the third calculation step, the ratio of the area as a gap is calculated from the relationship of (TA-TB)/TA.

First, the self-supporting film portion of the pellicle film is transferred to the substrate in the same manner as in (1.1.2.1) Method of Measuring Packing Density Parameter described above. The transferred self-supporting film portion is cut along the film thickness direction of the self-supporting film portion. A cross-section of the self-supporting film portion is observed using a TEM (magnification: from 50,000 to 400,000 times; it is preferable to set the observation magnification at which 5 nm is 100 pixels or more), thereby obtaining a plurality of fourth TEM images (see FIG. 14). From the plurality of fourth TEM images, 10 single bundles are selected, with which it is easy to recognize the cross-section of one single bundle. The resolution of the TEM is preferably such that 5 nm corresponds to 100 pixels or more in the TEM image.

Next, in a 20 nm×20 nm range, including a single bundle of a fourth TEM image, the center point of the annular outline of each of the plurality of CNTs in the fourth TEM image is identified (see FIG. 16).

Figure 14:
FIG. 14 is a TEM image of a cross-section of an example single bundle.

More specifically, as shown in FIG. 14, when a single bundle and CNTs constituting the single bundle are observed from the cross-sectional direction of the single bundle, the wall portion of a CNT appears as a dark annular line. The annular outline is extracted for the number of CNTs constituting the single bundle such that the region of the dark annular line becomes an outline.

In a cross-sectional TEM image of a CNT having two or more layers, approximately concentric (or co-centric) annular lines are seen at intervals of from about 0.3 nm to 0.4 nm. Therefore, an outline is extracted such that the dark annular region of the outermost layer becomes the outline (see FIG. 15).

After the outline of each of a plurality of CNTs is extracted, the geometric center (centroid) position coordinates of each annular outline are calculated, thereby identifying the center point of the annular outline of each of the plurality of CNTs.

A plurality of identified center points is connected by straight lines such that a plurality of triangles satisfying the following conditions (a) to (d) are formed (see FIG. 16):

(a) sides of each of the plurality of triangles do not intersect;
(b) three center points are selected such that a sum of three side lengths of a triangle is minimized;
(c) an interior angle of an outermost triangle among the plurality of triangles is less than 120°; and
(d) The side length is 1.6 times or less than the average length of all sides accounting for 80% or less from the shortest side.

Figure 17:
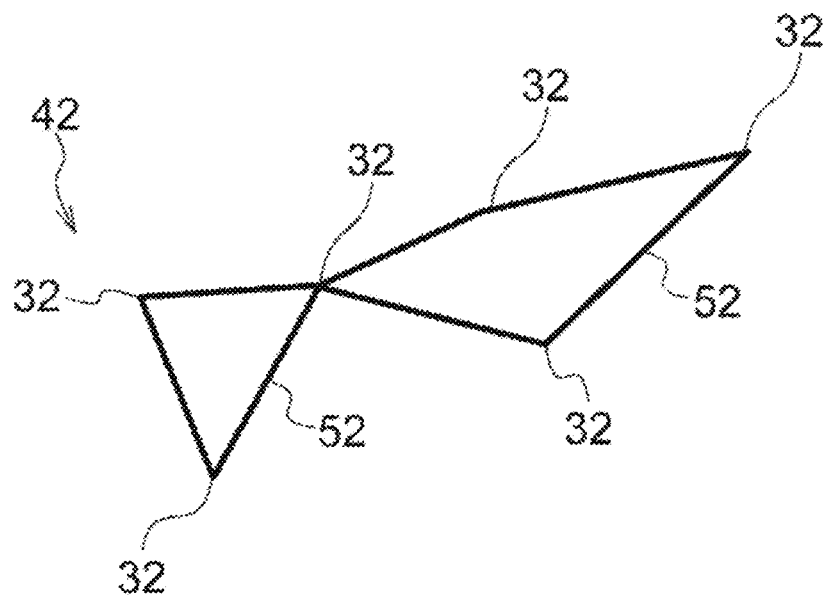
FIG. 17 is a diagram showing the polygon in FIG. 16.

A polygon is created by connecting the outermost sides of the triangulated shape (see FIG. 17).

The area of the polygon (TA) is calculated. The area of the polygon (TA) indicates, for example, the area of polygon 42 in FIG. 17.

The area inside the outline (TB) that exists in the polygon is calculated. The area inside the outline (TB) indicates, for example, the area of a plurality of cross-sections 62 of CNTs located inside polygon 42 in FIG. 19 (i.e., black portions inside polygon 42).

The unfilled area (=TA−TB) within the polygon is calculated. This is defined as the gap area. The gap area indicates, for example, the total area of a plurality of gaps 65 in FIG. 19.

By dividing this gap area by the area of the polygon, the ratio of the gap area within the polygon is calculated.

The gap area ratio is (TA−TB)/TA.

The gap area proportion is calculated for each of the 10 bundles, and the average value of the 10 bundles is obtained.

The average gap area proportion is preferably 30% or less, more preferably 25% or less, still more preferably 20% or less.

As long as the average gap area proportion is within the above-described range, the distances between center points of a plurality of CNTs constituting a single bundle are short, and the CNTs constituting a single bundle are packed with a small gap, making it possible to suppress film reduction even under exposure to hydrogen plasma.

(1.1.6) Defect (G/D) Distribution

It is considered that when CNTs and hydrogen plasma react such that the CNTs are etched, the etching reaction of the CNTs progresses starting from defective portions existing on the CNT surface.

By analyzing the linearity of CNTs by electron microscope observation, it is possible to evaluate the topological defect density of CNTs. However, it is considered that not only topological defects but also structural defects on the CNT surface caused by an oxidation reaction and the like on the CNT surface react with hydrogen plasma such that the CNT etching reaction progresses.

Methods other than electron microscope observation for evaluating structural defects such as topological defects and oxidation include, for example, methods involving Raman spectroscopy.

In the Raman analysis of CNT samples, a method for evaluating purity whereby the ratio of the intensity of the D band (Raman shift: about 1350 cm$^{-1}$) and the intensity of the G band (Raman shift: about 1580 cm$^{-1}$) are used as a criterion to determine the quality of CNTs is commonly used.

The G-band is a predominant Raman active mode in graphite structures and is derived from sp2-bonded carbon representing the planar structure of carbon nanotubes. Meanwhile, the D band is a mode derived from disturbances and defects, such as structural defects and open ends of carbon nanotubes.

In a general Raman spectroscopy, the Raman spectrum of a CNT thin film reflects the average structure of CNT chains existing inside the laser-irradiated region of the CNT thin film. In a general microscopic Raman spectrometer, the laser irradiation size is about 1 μm in diameter. In the case of a CNT thin film having a thickness of about 15 nm consisting of single-wall CNTs, the total length of single-wall CNTs included in a spot diameter of 1 μm is estimated to be from about 1000 μm to 2000 μm. Further, assuming that the length of one CNT is 1 μm, the total number of CNTs constituting the CNT thin film included in the above-described spot diameter of 1 μm is from about 1000 to 2000. From these facts, the structural information obtained by a general microscopic Raman apparatus reflects the average structural information of 1000 or more CNTs (1000 μm or more in length).

The etching reaction of a thin film of CNTs by hydrogen plasma is a nanoscale reaction that occurs on the surface of one CNT. Therefore, the average defect information at the macroscale mentioned above is unimportant, but the scale defect density occurring in local CNT bundles of from 10 nm to 100 nm is essential.

For example, the following two cases in which the defect distribution is different for 1000 CNTs having a length of 1 m included in a field of view of 1 m are considered.

One is a "case in which there are a total of 1000 defects in 1000 CNTs having a length of 1 μm, and each defect exists in a state of being dispersed at a different CNT position (1000 places) without being adjacent to each other."

The other is a "case in which about 10 defects are adjacent to or localized in one CNT, and such defect clusters are distributed in 100 CNTs."

In the above-described two cases in which the defect distribution is different, it is expected that the etching reactivity of hydrogen radicals is different, and thus it is considered that etching proceeds more easily in CNTs in which defects are adjacent and localized.

Microscopic Raman spectroscopy with a spot size of about 1 m makes it difficult to detect the above-described difference in defect distribution. Therefore, it is necessary to use a defect density evaluation method with a spatial resolution of 100 nm or less, which is a smaller spatial resolution.

Techniques for evaluating such nanoscale defect density include linearity evaluation using an electron microscope as well as tip-enhanced Raman scattering (TERS).

In TERS, when the tip of a nanostructured probe is irradiated with excitation light, localized surface plasmons are generated at the tip of the probe. Raman imaging with nanoscale spatial resolution becomes possible by measuring Raman scattered light enhanced by the localized surface plasmons.

Combining morphological observation by AFM and Raman imaging by TERS makes it possible to simultaneously acquire an AFM image and a Raman mapping image with nano-level spatial resolution.

As an apparatus combining AFM measurement and Raman spectroscopic measurement, for example, an AFM-Raman apparatus (apparatus name: XploRA nano) manufactured by HORIBA, Ltd. can be used.

Analysis of CNTs using AFM measurement and Raman spectroscopy can be referred to, for example, a non-patent literature (EPJ Techniques and Instrumentation volume 2, Article number: 9 (2015) Tip-enhanced Raman spectroscopy: principles and applications Naresh Kumar, Sandro Mignuzzi, Weitao Su, Debdulal Roy).

The pellicle film according to the first embodiment includes
   a plurality of carbon nanotubes forming a bundle,
   in which a minimum value of a ratio (G/D) of a G-band intensity to a D-band intensity at 7 locations within a predetermined bundle region in a cross-section of the pellicle film, cut along a bundle axial direction is preferably 0.80 or more.

Each of the D-band intensity and the G-band intensity is a measurement value obtained by Raman imaging measurement.

The predetermined bundle region indicates a region in a bundle having a diameter of 10 nm or more at a spatial resolution of 20 nm or less in a 500 nm×500 nm measurement area of the cross-section.

The D-band intensity is a local maximum value of Raman scattering intensity in a Raman shift range of from 1300 cm$^{-1}$ to 1400 cm$^{-1}$.

The G-band intensity is a local maximum value of Raman scattering intensity in a Raman shift range of from 1550 cm$^{-1}$ to 1610 cm$^{-1}$.

The fact that the ratio (G/D) is within the above-described range means that there are few defects on the CNT surface. Therefore, when the CNTs and the hydrogen plasma react with each other to etch the CNTs, the etching reaction of the CNTs hardly progresses.

The lower limit of the ratio (G/D) is preferably 1 or more, more preferably 2 or more, still more preferably 5 or more.

The upper limit of the ratio (G/D) is not particularly limited and can be, for example, 100 or less, 50 or less, or 20 or less.

From these viewpoints, the ratio (G/D) is preferably from 0.80 to 100, more preferably from 1 to 100, still more preferably from 2 to 100, yet still more preferably from 2 to 50, particularly preferably from 2 to 20, further preferably from 5 to 20.

The intervals between the seven measurement points in the Raman imaging measurement can each be set to 30 nm.

(1.1.7) Method of Evaluating First Lifetime of Pellicle Film

As a method of evaluating the pellicle film lifetime, a method of irradiating a CNT film with EUV light in a hydrogen atmosphere using an EUV light source such as a synchrotron may be used.

The EUV irradiation intensity is preferably from 5 W/cm$^2$ to 60 W/cm$^2$, more preferably from 10 W/cm$^2$ to 50 W/cm$^2$.

The EUV irradiation intensity currently used for the mass production of semiconductor devices is about 20 W/cm$^2$, and the light source intensity used for CNTs is assumed to be 30 W/cm$^2$ or more. Therefore, it is preferable to irradiate a CNT film with EUV light at an irradiation intensity close to the environment used for the mass production of semiconductor devices.

When a pellicle film is irradiated with high-intensity EUV light, the pellicle film absorbs the EUV light and reaches a temperature of 500° C. or higher. Therefore, the temperature rise effect on the etching reaction can be reflected in the evaluation results of the CNT lifetime.

The EUV irradiation area is preferably 0.5 mm² or more. It is preferable that the shape of the irradiation area has an aspect ratio of 10 or less when the shape is rectangular. The "aspect ratio" refers to the ratio of the length of the long side to the length of the short side. As long as the EUV irradiation region has an area of 0.5 mm² or more and an aspect ratio of 10 or less, the effect of suppressing temperature rise due to heat conduction of the pellicle film can be prevented in the EUV irradiation area.

The hydrogen pressure is more preferably from 0.1 Pa to 100 Pa, more preferably from 1 Pa to 50 Pa. The hydrogen pressure may be higher for the acceleration test.

By repeating EUV light irradiation (hereinafter also referred to as "turning ON irradiation") and not EUV light irradiation (hereinafter also referred to as "turning OFF irradiation"), or by scanning the beam, a heating and cooling cycle may be performed. In an actual EUV exposure environment, since the EUV light scans the pellicle surface, the pellicle film is repeatedly heated and cooled. Therefore, in the EUV irradiation experiment, the actual exposure environment can be simulated by performing a cycle of turning ON and OFF the irradiation of the EUV light or scanning.

The cycle of heating and cooling is preferably from 0.01 seconds to 2 seconds, more preferably from 0.1 seconds to 1 second. In addition, the duty ratio between turning ON irradiation and turning OFF irradiation (period of ON/period of one cycle) is preferably from 0.01 to 0.8, more preferably from 0.1 to 0.5.

The change rate of the first transmittance is preferably from 2% or less, more preferably from 1% or less. The "change rate of the first transmittance" refers to the proportion (%) of the transmittance of the pellicle film after the pellicle film is subjected to the first irradiation to the transmittance of the pellicle film before the pellicle film is subjected to the first irradiation. The "first irradiation" refers to irradiation with a hydrogen pressure of 5 Pa, a duty ratio of 1, an irradiation intensity of from 30 W/cm² to 40 W/cm², and a total time of exposure of the pellicle film to EUV light for 60 minutes.

The amount of change in the first film thickness is preferably 6 nm or less, more preferably 3 nm or less. The "amount of change in the first film thickness" refers to the proportion (%) of the film thickness of the pellicle film after the pellicle film is subjected to the first irradiation to the film thickness of the pellicle film before the pellicle film is subjected to the first irradiation.

The duty ratio may be changed as follows.

The change rate of the second transmittance is preferably from 2% or less, more preferably from 1% or less. The "change rate of the second transmittance" refers to the proportion (%) of the transmittance of the pellicle film after the pellicle film is subjected to the second irradiation to the transmittance of the pellicle film before the pellicle film is subjected to the second irradiation. The "second irradiation" refers to irradiation with a hydrogen pressure of 5 Pa, a duty ratio of from 0.01 to 0.8, an irradiation intensity of from 30 W/cm² to 40 W/cm², and a total time of exposure of the pellicle film to EUV light for 60 minutes.

The amount of change in the second film thickness is preferably 6 nm or less, more preferably 3 nm or less. The "amount of change in the second film thickness" refers to the proportion (%) of the film thickness of the pellicle film after the pellicle film is subjected to the second irradiation to the film thickness of the pellicle film before the pellicle film is subjected to the second irradiation.

(1.1.8) Method of Evaluating Second Lifetime of Pellicle Film

As a method of evaluating the pellicle film lifetime, a method using gas species other than hydrogen plasma can be used. As the gas species, oxygen plasma, argon plasma, nitrogen plasma, ammonia plasma, or the like may be used.

The method of evaluating the pellicle film lifetime may be a method using a so-called remote plasma processing method in the plasma processing step. In the remote plasma processing method, the plasma generation chamber and the plasma processing chamber are separated, and the processing is performed in an environment without electric field action.

The method of evaluating the pellicle film lifetime may also be a method of reacting hydrogen gas over a hot tungsten catalyst to produce atomic hydrogen and exposing the atomic hydrogen to a pellicle film.

(1.1.9) Pellicle Film Structure

In the first embodiment, the structure of the pellicle film is a non-woven structure (irregular network structure) with a plurality of CNTs. Thus, the pellicle film has air permeability. Specifically, during EUV exposure, the pellicle film communicates the internal space of the pellicle and the external space of the pellicle. The "internal space of the pellicle" refers to the space surrounded by the pellicle and the photomask. The "external space of the pellicle" refers to the space not surrounded by the pellicle and the photomask. As a result, during EUV exposure, the pellicle film can easily create a vacuum or reduced pressure environment in the internal space of the pellicle.

Since CNTs are usually fibrous, the pellicle film as a whole tends to have a non-woven fabric structure.

(1.1.10) Film Thickness of Pellicle Film

In the first embodiment, the film thickness of the pellicle film is not particularly limited and can be, for example, from 2 nm to 200 nm.

From the viewpoint of increasing the EUV light transmittance, the thickness of the pellicle film is preferably 100 nm or less, more preferably 50 nm or less, still more preferably 40 nm or less, yet still more preferably 30 nm or less, particularly preferably 20 nm or less.

From the viewpoint of fragility of the pellicle film and the viewpoint of the foreign matter shielding property (i.e., the viewpoint of prevent foreign matter from passing through the pellicle film), the thickness of the pellicle film is preferably 4 nm or more, more preferably 6 nm or more, still more preferably 10 nm or more.

From these viewpoints, the thickness of the pellicle film is preferably from 2 nm to 100 nm, more preferably from 2 nm to 50 nm, still more preferably from 2 nm to 40 nm, particularly preferably from 2 nm to 30 nm, further preferably from 4 nm to 30 nm.

(1.1.10.1) Method of Measuring Film Thickness

The film thickness of the pellicle film is obtained by transferring the self-supporting film portion of the pellicle film of the pellicle, which will be described later, onto a silicon substrate and using a reflectance spectroscopic film thickness meter (F50-UV manufactured by Filmetrics, INC.).

Specifically, the film thickness is measured as follows.

<Transfer>

A self-supporting film portion of a pellicle film of a pellicle, which will be described later, is transferred onto a silicon substrate. Specifically, a solvent is added dropwise onto the silicon substrate. A pellicle is placed on the silicon substrate such that the pellicle film of the pellicle is opposed to the substrate. Examples of the solvent include water and an organic solvent. The solvent is dried, thereby allowing the pellicle film to be closely attached to the silicon substrate. The silicon substrate is immobilized, and the pellicle frame of the pellicle is lifted, thereby separating the self-supporting film portion from the pellicle to allow the self-supporting film portion to be transferred to the substrate.

<Measurement of Reflection Spectrum>

A reflectance spectrum is measured in a wavelength range of from 200 nm to 600 nm with a wavelength interval of from 1 nm to 2 nm at each measurement point of the self-supporting film portion transferred to the silicon substrate.

To measure the reflectance spectrum, a reflectance spectroscopic film thickness meter (for example, model: F50-UV manufactured by Filmetrics, INC.; spot diameter: 1.5 mm) is used as a reflectance measuring device. A silicon wafer is used as a reference for reflection intensity measurement.

The reflectance Rs (λ) is obtained by the following Formula.

$$Rs(\lambda) = \frac{I_s(\lambda)}{I_{ref}(\lambda)} R_{ref}(\lambda)$$

As used herein, Is (λ) represents the reflection intensity of the self-supporting film portion on the silicon substrate at the wavelength λ, Iref (λ) represents the reflection intensity of a reference, and Rref (λ) represents the absolute reflectance of a reference.

When a silicon wafer is used as a reference, Rref (λ) can be obtained by calculation because the optical constant of the silicon wafer is known. The gain, exposure time, and the like are the same conditions for measuring the reflection intensity of the self-supporting film portion on the silicon substrate and the reference. Thus, the absolute reflectance of the self-supporting film portion on the silicon substrate is obtained.

<Calculation of Film Thickness>

The film thickness at each measurement point of the self-supporting film portion is calculated by analyzing the reflectance spectrum in a wavelength range of from 225 nm to 500 nm by the least squares method using the values of optical constants (refractive index: n; extinction coefficient: k) shown in Table 1 as optical constants of the CNT film and the three-layer model of air layer/CNT film layer/silicon substrate.

The film thickness at a "measurement position" of the self-supporting film portion is defined as the average value of the film thickness at each of the 9 measurement points included in the "measurement position" of the self-supporting film. The shape of the self-supporting film portion viewed from the thickness direction of the self-supporting film portion is rectangular. The diagonal lines of the self-supporting film portion are defined as the X-axis and the Y-axis. As the measurement points in the X-axis direction, 3 points are set with an interval of 2 mm as the distance between center points at adjacent measurement points. As the measurement points in the Y-axis direction, 3 points are set with an interval of 2 mm as the distance between center points at adjacent measurement points. In other words, 3 points in the vertical direction×3 points in the horizontal direction as a total of 9 measurement points are set as "measurement positions."

A method of calculating the film thickness at each measurement point of the self-supporting film portion by analyzing the reflectance spectrum in a wavelength range of from 225 nm to 500 nm using the least squares method will be described below.

TABLE 1

| [nm] | n | k |
|------|------|------|
| 225 | 1.20 | 0.61 |
| 248 | 1.34 | 0.75 |
| 276 | 1.52 | 0.76 |
| 310 | 1.64 | 0.72 |
| 354 | 1.71 | 0.68 |
| 413 | 1.75 | 0.68 |
| 496 | 1.81 | 0.70 |

The film thickness of the self-supporting film portion is calculated by the relational expression of the following Formulas (a) to (c) using a three-layer model consisting of air layer/CNT film layer/silicon substrate.

The reflectance Rs is represented by the following Formula (a) using the amplitude reflectance rs.

$$R_s = r_s \cdot r_s^* \quad (a)$$

In Formula (a) above, the asterisk (*) represents a complex conjugate.

The amplitude reflectance rs from the three layers (air layer/CNT film layer/silicon substrate) is represented by the following Formula (b).

$$r_s = (r_{01} + r_{12} \exp(-i\delta))/(1 + r_{01} r_{12} \exp(-i\delta)) \quad (b)$$

In Formula (b) above, $r_{01}$ represents an amplitude reflectance from the interface between the air layer and the self-supporting film portion layer, $r_{12}$ represents an amplitude reflectance from the interface between the self-supporting film portion layer and the silicon substrate layer, and i represents an imaginary unit.

In Formula (b) above, δ refers to a phase difference that occurs when light having wavelength λ makes one round trip in the film and is represented by the following Formula (c).

$$\delta = \left(\frac{4\pi}{\lambda}\right) Nd \cos\phi. \quad (c)$$

In Formula (c) above, d represents a film thickness of the self-supporting film portion, N represents a complex refractive index (N=n−ik), φ represents an angle of incidence, and i represents an imaginary unit.

The film thickness of the self-supporting film portion can be calculated by the least squares method with the film thickness d as a variable for the reflectance Rs in a wavelength range of from 225 nm to 500 nm using the relational expression of Formulas (a) to (c) above.

The calculated film thickness of the self-supporting film at the "measurement position" is regarded as the film thickness of the pellicle film.

(1.1.11) Antioxidant Layer

In the first embodiment, the pellicle film may include an antioxidant layer. The antioxidant layer is layered on at least one main surface of the pellicle film. Accordingly, oxidation of the pellicle film is suppressed during EUV light irradiation or pellicle storage.

The material of the antioxidant layer is not particularly limited as long as it is stable against EUV light. Examples of the antioxidant layer include $SiO_x$ ($x \leq 2$), $Si_xN_y$ ($x/y$ is from 0.7 to 1.5), SiON, $Y_2O_3$, YN, Mo, Ru, Rb, Sr, Y, Zr, Nb, and Rh.

The thickness of the antioxidant layer is preferably from 1 nm to 10 nm, more preferably from 2 nm to 5 nm, from the viewpoint of suppressing the absorption of EUV light by the antioxidant layer and the decrease in the transmittance of the pellicle film for EUV light.

(1.1.6) CNT

In the first embodiment, the pellicle film includes a plurality of CNTs.

Accordingly, the pellicle film is superior in mechanical strength to a case in which the material of the pellicle film is SiN, polysilicon, or the like.

The CNT structure is not particularly limited and may be single-wall or multi-wall.

Hereinafter, a single-wall CNT is referred to as a "single-layer CNT," and a multi-wall CNT is referred to as a "multi-layer CNT."

As the diameter of CNT becomes smaller, it tends to form a bundle (bundle structure) firmly. This is presumed because as the diameter of CNT becomes thinner, the specific surface area of CNT increases, and the flexibility and bendability of CNT also increase. Thus, a plurality of CNTs can be arranged parallel to each other, and the CNTs arranged in parallel make line contact with each other, thereby having a wide contact area, resulting in strengthened van der Waals force between CNTs.

Meanwhile, in the case of multi-layer CNTs, as the number of layers and diameter increases, the flexibility and specific surface area of CNTs decrease, making it difficult in terms of spatial arrangement to arrange CNTs in parallel. Thus, the CNTs cannot make direct line contact with each other and become point-like contact close to intersecting contact. As a result, the van der Waals force between CNTs is weakened because the contact area between CNTs is small.

Accordingly, a plurality of single-layer CNTs is easier to form a bundle than a plurality of multi-layer CNTs.

The number of CNTs forming a bundle is 3 or more, preferably from 4 to 100, more preferably from 5 to 50. There may be CNTs that do not form a bundle, whether single-layer CNTs or multi-layer CNTs.

The outer diameter of a CNT tube (i.e., the width of CNT) can be, for example, from 0.8 nm to 400.

The lower limit of the outer diameter of a CNT tube is preferably 1 nm or more, more preferably 4 nm or more, still more preferably 8 nm or more, yet still more preferably 10 nm or more, particularly preferably 20 nm or more from the viewpoint of suppressing the occurrence of damage to the pellicle film.

The upper limit of the outer diameter of a CNT tube is preferably 100 nm or less, more preferably 80 nm or less, still more preferably 60 nm or less, particularly preferably 40 nm or less from the viewpoint of improving the EUV light transmittance of the pellicle film.

The "outer diameter of a CNT tube" refers to the outer diameter of a single tube in a case in which CNTs exist as monofilaments in the pellicle film or the outer diameter of a single bundle in a case in which CNTs are present as a batch (i.e., a bundle).

The diameter (outer diameter) of a bundle formed of single-layer CNTs (hereinafter referred to as "single-layer bundle") may be, for example, from 4 nm to 400 nm.

The lower limit of the diameter of a single-layer bundle is preferably 10 nm or more, more preferably 20 nm or more, still more preferably 40 nm or more, particularly preferably 50 nm or more from the viewpoint of suppressing the occurrence of damage to the pellicle film.

The upper limit of the diameter of a single-layer bundle is preferably 100 nm or less, more preferably 80 nm or less, still more preferably 60 nm or less, particularly preferably 40 nm or less from the viewpoint of improving the EUV light transmittance of the pellicle film.

The diameter (outer diameter) of a bundle formed of multi-layer CNTs (hereinafter referred to as "multi-layer bundle") may be, for example, from 4 nm to 400 nm.

The lower limit of the diameter of a multi-layer bundle is preferably 10 nm or more, more preferably 20 nm or more, still more preferably 40 nm or more, particularly preferably 50 nm or more from the viewpoint of suppressing the occurrence of damage to the pellicle film.

The upper limit of the diameter of a multi-layer bundle is preferably 100 nm or less, more preferably 80 nm or less, still more preferably 60 nm or less, particularly preferably 40 nm or less from the viewpoint of improving the EUV light transmittance of the pellicle film.

The CNT length is preferably 10 nm or more.

When the CNT length is 10 nm or more, CNTs are well entangled with each other, and the mechanical strength of the pellicle film is excellent.

The upper limit of the CNT length is not particularly limited and is preferably 10 cm or less, more preferably 1 cm or less, still more preferably 100 μm or less.

From these viewpoints, the CNT length is preferably from 10 nm to 10 cm, more preferably from 10 nm to 1 cm, still more preferably from 10 nm to 100 μm.

The outer diameter and length of a CNT tube are each defined as an average arithmetic value of values measured for 20 or more carbon materials (primary particles) by electron microscope observation.

A scanning electron microscope (SEM), a transmission electron microscope (TEM), or the like can be used as an electron microscope.

(1.2) Pellicle

The pellicle according to the first embodiment includes the pellicle film according to the first embodiment and a pellicle frame. The pellicle film is supported by a pellicle frame.

Since the pellicle according to the first embodiment includes the pellicle film according to the first embodiment, the same effects as those of the pellicle film according to the first embodiment can be obtained.

The pellicle film may be or is not necessarily in contact with the pellicle frame. The pellicle frame is a tubular object. The pellicle frame has an end face (hereinafter referred to as "pellicle film end face") on one side in the thickness direction. When the "pellicle film is in contact with the pellicle frame," it shows that the pellicle film is directly immobilized to the pellicle film end face. When the "pellicle film is not in contact with the pellicle frame," it shows that the pellicle film is immobilized to the end face for the pellicle film via an adhesive layer.

Examples of an adhesive include, but are not particularly limited to, acrylic resin adhesives, epoxy resin adhesives, polyimide resin adhesives, silicone resin adhesives, inorganic adhesives, double-sided adhesive tape, polyolefin adhesives, and hydrogenated styrene adhesives. The adhesive is a concept that includes not only adhesives but also pressure-sensitive adhesives. The thickness of the adhesive layer is not particularly limited, and it is, for example, from 10 μm to 1 mm.

(1.2.1) Pellicle Frame

The pellicle frame has a through hole for exposure. The through hole for exposure indicates a space through which light transmitted through the pellicle film passes such that the light reaches a photomask.

The shape of the pellicle frame in the thickness direction of the pellicle frame is, for example, rectangular. The rectangular shape may be a square or an oblong rectangle.

The pellicle frame may have a vent hole. The vent hole is formed, for example, in the side surfaces of the pellicle frame. The vent hole communicates the internal space of the pellicle and the external space of the pellicle when the pellicle frame is attached to the photomask.

The rectangular pellicle frame is configured to have four sides when viewed from the thickness direction.

The length of one side of the pellicle frame in the longitudinal direction is preferably 200 mm or less. The size and the like of the pellicle frame are standardized according to the type of exposure device. When the length of one side of the pellicle frame in the longitudinal direction is 200 mm or less, it satisfies the size standardized for exposure using EUV light.

The length of one side of the pellicle frame in the short direction can be, for example, from 5 mm to 180 mm, preferably from 80 mm to 170 mm, more preferably from 100 mm to 160 mm.

The height of the pellicle frame (i.e., the length of the pellicle frame in the thickness direction) is not particularly limited, and it is preferably 3.0 mm or less, more preferably 2.4 mm or less, still more preferably 2.375 mm or less. Accordingly, the pellicle frame meets the standardized size for EUV exposure. The height of the pellicle frame standardized for EUV exposure is, for example, 2.375 mm.

The mass of the pellicle frame is not particularly limited, and it is preferably 20 g or less, more preferably 15 g or less. Accordingly, the pellicle frame is suitable for EUV exposure applications.

Examples of the material of the pellicle frame include, but are not particularly limited to, quartz glass, metal, carbon-based material, resin, silicon, and ceramic-based material.

The metal may be a pure metal or an alloy. A pure metal consists of a single metallic element. Examples of the pure metal include aluminum and titanium. An alloy consists of a plurality of metallic elements or a metallic element and a non-metallic element. Examples of the alloy include stainless steel, magnesium alloys, steel, carbon steel, and invar. Examples of the resin include polyethylene. Examples of the ceramic-based material include silicon nitride (SiN), silicon carbide (SiC), and alumina ($Al_2O_3$).

The structure of the pellicle frame may be a single item or an assembly. A single item is obtained by cutting one raw material plate. An "assembly" is obtained by unifying a plurality of members. Examples of a method of unifying a plurality of members include known methods using adhesive agents, fastening parts, and the like. Examples of fastening parts include bolts, nuts, screws, rivets, and pins. In a case in which the pellicle frame is an assembly, the materials of the plurality of members may be different.

(1.2.2) Adhesive Layer

The pellicle may further include an adhesive layer. The adhesive layer allows the pellicle to adhere to the photomask. The pellicle frame has an end face (hereinafter referred to as "photomask end face") on the other side in the thickness direction. The adhesive layer is formed on the photomask end face.

The adhesive layer is a gel-like soft solid. It is preferable that the adhesive layer has fluidity and cohesion. "Fluidity" refers to a property of contacting and getting wet with the photomask, which is an adherend. "Cohesion" refers to a property of resisting detachment from the photomask.

The adhesive layer consists of an adhesive resin layer. Examples of the adhesive layer resin layer include, but are not particularly limited to, an acrylic adhesive, a silicone adhesive, a styrene adhesive, a urethane adhesive, and an olefin adhesive. The thickness of the adhesive layer is not particularly limited and is preferably from 10 μm to 500 μm.

(1.3) Exposure Original Plate

The exposure original plate according to the first embodiment includes a photomask and the pellicle according to the first embodiment. The photomask is an original plate with a circuit pattern. The pellicle is attached to a side of the photomask, on which a circuit pattern is formed.

Since the exposure original plate according to the first embodiment includes the pellicle according to the first embodiment, it has the same effects as the pellicle according to the first embodiment.

Examples of a method of attaching a photomask to a pellicle (hereinafter referred to as "attachment method") include, but are not particularly limited to, a method using the adhesive layer described above, a method using fastening parts, and a method using the attractive force of a magnet.

The photomask has a support substrate, a reflective layer, and an absorber layer. It is preferable that the support substrate, the reflective layer, and the absorber layer are layered in that order. In this case, the pellicle is attached to a side of the photomask, on which the reflective layer and the absorber layer are provided.

The absorber layer partially absorbs EUV light such that a desired image is formed on a sensitive substrate (e.g., a semiconductor substrate coated with a photoresist film). Examples of the reflective layer include a multi-layer film of molybdenum (Mo) and silicon (Si). The material of the absorber layer may be a highly EUV-absorptive material or the like. Examples of a highly EUV-absorptive material or the like include chromium (Cr) and tantalum nitride.

(1.4) Exposure Device

The exposure device according to the first embodiment includes an EUV light source, the exposure original plate according to the first embodiment, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the first embodiment has the same effects as the exposure original plate according to the first embodiment. Further, since the exposure device according to the first embodiment has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(1.5) Method of Producing Pellicle Film

The method of producing a pellicle film according to the first embodiment is a method of producing the pellicle film according to the first embodiment, which includes a coating step. In the coating step, a dispersion liquid (hereinafter referred to as "CNT dispersion liquid") in which a plurality of CNTs synthesized by the direct injection pyrolytic synthesis method (hereinafter referred to as "eDIPS method") is dispersed is applied to a substrate.

Since the method of producing a pellicle film according to the first embodiment has the above-described configuration, a pellicle film, for which the average value of linearity parameters of a plurality of CNTs is 0.10 or less, is obtained.

It is presumed that the main reason for this is that each of the plurality of CNTs synthesized by the eDiPs method is linear and has a low structural defect density. CNTs synthesized by a production method other than the eDIPS method may be used as long as the CNTs are linear and have a low structural defect density.

It is preferable that the method of producing a pellicle film according to the first embodiment includes a preparation step, a dispersion liquid preparation step, a cleaning step, and a separation step, which will be described later, in addition to the coating step. In a case in which the method of producing a pellicle film includes the preparation step, the dispersion liquid preparation step, the coating step, the cleaning step, and the separation step, the preparation step, the dispersion liquid preparation step, the coating step, the cleaning step, and the separation step are carried out in that order.

A case in which the method of producing a pellicle film according to the first embodiment includes a preparation step, a dispersion liquid preparation step, a cleaning step, and a separation step, which will be described later, in addition to the coating step, will be described below.

(1.5.1) Preparation Step

In the preparation step, a plurality of CNTs synthesized by a direct injection pyrolytic synthesis method (hereinafter referred to as "eDIPS method") are prepared.

The enhanced direct injection pyrolytic synthesis (e-DIPS) method is a floating catalyst method improved from the direct injection pyrolytic synthesis method (hereinafter referred to as "DIPS method").

In the DIPS method, single-layer CNTs are synthesized in a flowing gas phase by atomizing a catalyst (or catalyst precursor) and a hydrocarbon-based solution containing a reaction accelerator and introducing them into a high-temperature heating furnace.

In the e-DIPS method, attention is paid to the particle formation process in which ferrocene, which is used as a catalyst, has different particle sizes on the upstream and downstream sides of a reactor. This method tends to cause decomposition in the carrier gas, unlike the DIPS method, which uses only an organic solvent as a carbon source. In other words, in this method, the growth point of single-layer CNTs is controlled by mixing a second carbon source that tends to be a carbon source.

Specifically, production can be carried out with reference to Saitoetal., J. Nanosci. Nanotechnol., 8(2008)6153-6157.

A plurality of CNTs synthesized by the e-DIPS method include single-layer CNTs.

CNTs synthesized by the e-DIPS method may include two-layer or three-layer CNTs or two-layer and three-layer CNTs, in addition to single-layer CNTs.

Examples of a method of preparing a plurality of CNTs synthesized by the e-DIPS method include a method of synthesizing a plurality of CNTs by the e-DIPS method and a method using a plurality of commercially available CNTs synthesized by the e-DIPS method.

Examples of a plurality of commercially available CNTs synthesized by the e-DIPS method include "MEIJOeDIPS" (trade name) manufactured by Meijo Nano Carbon Co., Ltd.

(1.5.2) Dispersion Liquid Preparation Step

In the dispersion liquid preparation step, a plurality of CNTs synthesized by the e-DIPS method, a dispersant, and a solvent are mixed, thereby preparing a dispersion liquid. Some of a plurality of CNTs synthesized by the e-DIPS method form a plurality of bundles. Accordingly, a dispersion liquid, in which a plurality of bundles is dispersed, is obtained.

Examples of a dispersant include, but are not particularly limited to, polyacrylic acid, a flavin derivative, sodium cholate, sodium deoxycholate, sodium dodecyl sulfate, sodium dodecylbenzenesulfonate, sodium polyacrylate, and organic side chain flavin.

The amount of the dispersant to be added is not particularly limited and is preferably from 10 to 1000 parts by mass, more preferably from 30 to 500 parts by mass, with respect to the total amount of the plurality of CNTs synthesized by the e-DIPS method.

Examples of a solvent include, but are not particularly limited to, isopropyl alcohol, ethanol, toluene, xylene, ethylbenzene, n-methylpyrrolidone, N,N-dimethylformamide, propylene glycol, and methyl isobutyl ketone, which selected depending on the type of the dispersant and the like, if appropriate.

The amount of the solvent to be added is preferably from 0.005 to 1 part by mass, more preferably from 0.01 to 0.1 parts by mass, with respect to the total amount of the dispersion liquid.

Examples of a method of mixing a plurality of CNTs synthesized by the e-DIPS method, a dispersant, and a solvent include, but are not particularly limited to, a method using cavitation (ultrasonic dispersion method), a method of applying mechanical shear force (e.g., a magnetic stirrer, ball mill, roller mill, vibration mill, kneader, or homogenizer), and a method using turbulence (e.g., jet mill (trade name: Nanomizer)).

To make the CNTs less likely to be damaged, it is preferable to reduce the force applied to CNTs when mixing a plurality of CNTs, a dispersant, and a solvent or performing ultracentrifugation. For example, it is preferable to shorten the mixing time for mixing a plurality of CNTs, a dispersant, and a solvent. The mixing time in the dispersion liquid preparation step is preferably less than 1 hour, more preferably 40 minutes or less.

(1.5.3) Coating Step

In the coating step, a CNT dispersion liquid is applied to a substrate. Accordingly, a coating film including a substrate in which a plurality of CNTs synthesized by the e-DIPS method is contained is obtained.

Examples of the shape of the substrate include, but are not particularly limited to, a circular shape and a rectangular shape.

The thickness of the substrate is preferably from 100 μm to 1000 μm, from the viewpoint of handling, more preferably from 200 μm to 1000 km.

The roughness Ra of the substrate is not particularly limited, but can be, for example, 10 μm or less. To improve the uniformity of the pellicle film, the roughness Ra of the substrate is preferably 100 nm or less, more preferably 10 nm or less, particularly preferably 1 nm or less.

Examples of the material of the substrate include, but are not particularly limited to, semiconductor materials, glass materials, ceramic materials, and filter paper. Examples of semiconductor materials include silicon (Si), germanium (Ge), silicon germanium (SiGe), silicon carbide (SiC), and gallium arsenide (GaAs). Examples of glass materials include quartz glass (silicon oxide ($SiO_2$)), soda glass, borosilicate glass, and sapphire. Examples of ceramic materials include silicon nitride (SiN), aluminum nitride (AlN), zirconia ($ZrO_2$), and aluminum oxide ($Al_2O_3$).

In a case in which the substrate is filter paper, a method of forming a CNT film on filter paper by adding a CNT dispersion liquid dropwise onto filter paper and then removing a solvent may be used.

Examples of a method of applying a CNT dispersion liquid to a substrate include, but are not particularly limited to, spin coating, dip coating, bar coating, spray coating, and electrospray coating.

(1.5.4) Cleaning Step

In the cleaning step, a coating film obtained in the coating step is cleaned. Accordingly, a pellicle film is obtained from which the dispersant contained in the coating film has been removed. By the method of cleaning a coating film, a pellicle film is obtained in which the average value of packing density parameters of a plurality of bundles described above is adjusted within a desired range.

Examples of the cleaning method include, but are not particularly limited to, alkaline cleaning and water cleaning. Alkaline cleaning indicates bringing an alkaline solution into contact with the coating film. A method of bringing water into contact with the coating film is described.

In the cleaning method, it is preferable to use a solution and/or a solvent in which a dispersant of CNTs is highly soluble in order to reduce the residual amount of the solution component to make it easier to obtain a pellicle film in which the average value of packing density parameters of CNTs is closer to 0.

A highly soluble solution and/or solvent may be selected depending on the type of dispersant, if appropriate.

In a case in which the molecular skeleton of a dispersant has bonds with a large difference in electronegativity (i.e., the molecular skeleton of the dispersant consists of the highly polar molecular skeleton), it is preferable to use a polar solvent as a cleaning solution. Examples of a highly polar dispersant include polyethylene glycol. Examples of a cleaning solution suitable for this dispersant include water and ethanol.

In a case in which the molecular skeleton of a dispersant has bonds with a small difference in electronegativity (i.e., the molecular skeleton of the dispersant consists of the weakly polar molecular skeleton), it is preferable to use a weakly polar solvent as a cleaning solution. Examples of a weakly polar dispersant include organic side chain flavin. Examples of a cleaning solution suitable for this dispersant include chloroform and toluene.

In a case in which a dispersant contains an ionic (cationic) solution, it is preferable to use an acidic solution as the cleaning solution. Examples of an ionic (cationic) dispersant include dodecyltrimethylammonium chloride. Examples of a cleaning solution suitable for this dispersant include water and an acidic aqueous solution.

In a case in which a dispersant contains an ionic (anionic) solution, it is preferable to use an alkaline solution as a cleaning solution. Examples of an anionic dispersant include polyacrylic acid and sodium polyacrylate. Examples of a cleaning solution suitable for this dispersant include water and an alkaline solution.

In particular, it is preferable to alkaline-clean a dispersion liquid dispersed with a polyacrylic acid solution in the cleaning method. Accordingly, a pellicle film is obtained in which the average value of packing density parameters of a plurality of bundles is closer to 0 than in the case of cleaning with water.

It is preferable that the alkaline solution contains a basic compound. Examples of a basic compound include ammonia, quaternary ammonium hydroxide, quaternary pyridinium hydroxide. Examples of quaternary ammonium hydroxide include tetramethylammonium hydroxide (TMAH) and choline.

(1.5.5) Separation Step

In the separation step, the pellicle film is separated from the substrate. Accordingly, an isolated pellicle film is obtained.

Hereinafter, the substrate and the pellicle film formed on the substrate are collectively referred to as "film-coated substrate."

Examples of a method of separating the pellicle film from the substrate include, but are not particularly limited to, a method of immersing a film-coated substrate in water. When the film-coated substrate is immersed in water, the pellicle film peels off from the substrate and floats on the water surface. Accordingly, an isolated pellicle film is obtained.

(2) First Modified Example (Packing Density Parameter)

(2.1) Pellicle Film

The pellicle film according to the first modified example includes a plurality of CNTs. At least some of the plurality of CNTs form a plurality of bundles. The average value of packing density parameters represented by Formula (2) above of the plurality of bundles may be 0.20 or less.

In the first modified example, as the pellicle film has the above-described configuration, it is unlikely to experience film reduction even when exposed to hydrogen plasma. It is presumed that this is due to the same reasons as in the first embodiment.

The pellicle according to the first modified example is the same as the pellicle according to the first embodiment except that the average value of packing density parameters may be 0.20 or less, and the average value of linearity parameters represented by Formula (1) above is not necessarily 0.10 or less. The description of the first embodiment of the disclosure can be used for the description of the first modified example of the disclosure.

The packing density parameter, a preferred range of the average value of packing density parameters, a method of measuring the packing density parameter, and the like are the same as in the first embodiment.

In the first modified example, the average value of packing density parameters of a plurality of bundles is preferably 0.15 or less.

As long as the average value of packing density parameters of a plurality of bundles is 0.15 or less, film reduction of a pellicle film can be further suppressed even when the pellicle film is exposed to hydrogen plasma.

In the first modified example, the average value of linearity parameters represented by Formula (1) above of the plurality of CNTs is preferably 0.10 or less.

As long as the average value of linearity parameters of a plurality of CNTs is 0.10 or less, film reduction is less likely to occur even under exposure to hydrogen plasma. It is presumed that this is due to the same reasons as in the first embodiment.

The linearity parameter, a preferred range of the average value of linearity parameters, a method of measuring the linearity parameter, and the like are the same as in the first embodiment.

In the first modified example, it is preferable that the pellicle film includes a plurality of carbon nanotubes forming a bundle, and the second diffraction peak ratio is 1.3 or more.

As long as the second diffraction peak ratio is within the above-described range, the diffusion of hydrogen radicals into a single bundle is further suppressed. As a result, the pellicle film exhibits higher lifetime characteristics and is unlikely to film reduction even when exposed to hydrogen plasma.

The second diffraction peak ratio, a preferred range of the second diffraction peak ratio, a method of measuring the second diffraction peak, and the like are the same as in the first embodiment.

In the first modified example, it is preferable that the pellicle film includes a plurality of carbon nanotubes forming a bundle and has a smoothness evaluation value of 0.070 ($nm^2/nm$) or less.

As long as the smoothness evaluation value is within the above-described range, even when the pellicle film is exposed to hydrogen plasma, the film reduction of the pellicle film can be suppressed.

The smoothness evaluation value, a preferred range of the smoothness evaluation value, a method of measuring the smoothness evaluation value, and the like are the same as in the first embodiment.

In the first modified example, it is preferable that the pellicle film includes a plurality of carbon nanotubes forming a bundle, for which the ratio (G/D) is 0.8 or more.

As long as the ratio (G/D) is within the above-described range, when the CNTs and the hydrogen plasma react with each other to etch the CNTs, the etching reaction of the CNTs hardly progresses.

The ratio (G/D), a preferred range of the ratio (G/D), a method of measuring the ratio (G/D), and the like are the same as in the first embodiment.

The first diffraction peak ratio, the average gap area proportion, the method of evaluating the first lifetime of a pellicle film, the method of evaluating the second lifetime of a pellicle film, and the like are the same as in the first embodiment.

In the first modified example, the structure of the pellicle film, the film thickness of the pellicle film, CNTs, and the like are the same as in the first embodiment.

In the first modified example, the pellicle film may include other layers as in the first embodiment.

(2.2) Pellicle

The pellicle according to the first modified example includes the pellicle film according to the first modified example and a pellicle frame. The pellicle film is supported by a pellicle frame.

Since the pellicle according to the first modified example includes the pellicle film according to the first modified example, it has the same effects as those of the pellicle film according to the first modified example.

In the first modified example, the pellicle may further include an adhesive layer. The pellicle frame, the adhesive layer, and the like are the same as in the first embodiment.

(2.3) Exposure Original Plate

The exposure original plate according to the first modified example includes a photomask and the pellicle according to the first modified example. The photomask is an original plate with a circuit pattern. The pellicle is attached to a side of the photomask, on which a circuit pattern is formed.

Since the exposure original plate according to the first modified example includes the pellicle according to the first modified example, it has the same effects as those of the pellicle according to the first modified example.

The attachment method, the photomask, and the like are the same as in the first embodiment.

(2.4) Exposure Device

The exposure device according to the first modified example includes an EUV light source, the exposure original plate according to the first modified example, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the first modified example has the same effects as the exposure original plate according to the first modified example. Further, since the exposure device according to the first modified example has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(2.5) Method of Producing Pellicle Film

The method of producing a pellicle film according to the first modified example is a method of producing the pellicle film according to the first modified example, which includes a coating step. In the coating step, a dispersion liquid in which a plurality of CNTs synthesized by the direct injection pyrolytic synthesis method is dispersed is applied to a substrate.

Since the method of producing a pellicle film according to the first modified example has the above-described configuration, a pellicle film having an average value of packing density parameters of 0.20 or less is obtained.

It is preferable that the method of producing a pellicle film according to the first modified example includes a preparation step, a dispersion liquid preparation step, a cleaning step, and a separation step in addition to the coating step. The coating step, the preparation step, the dispersion liquid preparation step, the cleaning step, the separation step, and the lie are the same as in the first embodiment.

In the first modified example, it is preferable that the method of producing a pellicle film further includes a cleaning step of alkaline-cleaning a coating film obtained in the coating step. Accordingly, a pellicle film is obtained from which the dispersant contained in the coating film has been removed.

(3) Second Modified Example (First Diffraction Peak Ratio)

(3.1) Pellicle Film

The pellicle film according to the second modified example includes a plurality of CNTs, the plurality of CNTs form a bundle, and the pellicle film may have a first diffraction peak ratio of 2 or more.

In the second modified example, as the pellicle film has the above-described configuration, it is unlikely to experience film reduction even when exposed to hydrogen plasma. It is presumed that this is due to the same reasons as in the first embodiment.

The pellicle according to the second modified example is the same as the pellicle according to the first embodiment except that the first diffraction peak ratio may be 2 or more, and the average value of linearity parameters represented by Formula (1) above is not necessarily 0.10 or less. The description of the first embodiment of the disclosure can be used for the description of the second modified example of the disclosure.

In the second modified example, the first diffraction peak ratio, a preferred range of the first diffraction peak ratio, a method of measuring the first diffraction peak ratio, and the like are the same as in the first embodiment.

In the second modified example, the average value of linearity parameters represented by Formula (1) above of a plurality of CNTs is preferably 0.10 or less.

As long as the average value of linearity parameters of a plurality of CNTs is 0.10 or less, film reduction is less likely to occur even under exposure to hydrogen plasma. It is presumed that this is due to the same reasons as in the first embodiment.

The linearity parameter, a preferred range of the average value of linearity parameters, a method of measuring the linearity parameter, and the like are the same as in the first embodiment.

In the second modified example, a plurality of CNTs form a plurality of bundles, and the average value of packing density parameters represented by Formula (2) above of the plurality of bundles may be 0.20 or less.

In the second modified example, as the pellicle film has the above-described configuration, it is unlikely to experience film reduction even when exposed to hydrogen plasma. It is presumed that this is due to the same reasons as in the first embodiment.

The packing density parameter, a preferred range of the average value of packing density parameters, a method of measuring the packing density parameter, and the like are the same as in the first embodiment.

In the second modified example, the average value of packing density parameters of a plurality of bundles is preferably 0.15 or less.

As long as the average value of packing density parameters of a plurality of bundles is 0.15 or less, film reduction of a pellicle film can be further suppressed even when the pellicle film is exposed to hydrogen plasma.

In the second modified example, it is preferable that the pellicle film includes a plurality of carbon nanotubes forming a bundle, and the second diffraction peak ratio is 1.3 or more.

As long as the second diffraction peak ratio is within the above-described range, the diffusion of hydrogen radicals into a single bundle is further suppressed. As a result, the pellicle film exhibits higher lifetime characteristics and is unlikely to experience film reduction even when exposed to hydrogen plasma.

The second diffraction peak ratio, a preferred range of the second diffraction peak ratio, a method of measuring the second diffraction peak, and the like are the same as in the first embodiment.

In the second modified example, it is preferable that the pellicle film includes a plurality of carbon nanotubes forming a bundle and has a smoothness evaluation value of 0.070 (nm$^2$/nm) or less.

As long as the smoothness evaluation value is within the above-described range, even when the pellicle film is exposed to hydrogen plasma, the film reduction of the pellicle film can be suppressed.

The smoothness evaluation value, a preferred range of the smoothness evaluation value, a method of measuring the smoothness evaluation value, and the like are the same as in the first embodiment.

In the second modified example, it is preferable that the pellicle film includes a plurality of carbon nanotubes forming a bundle, for which the ratio (G/D) is 0.8 or more.

As long as the ratio (G/D) is within the above-described range, when the CNTs and the hydrogen plasma react with each other to etch the CNTs, the etching reaction of the CNTs hardly progresses.

The ratio (G/D), a preferred range of the ratio (G/D), a method of measuring the ratio (G/D), and the like are the same as in the first embodiment.

The first diffraction peak ratio, the average gap area proportion, the method of evaluating the first lifetime of a pellicle film, the method of evaluating the first lifetime of a pellicle film, and the like are the same as in the first embodiment.

In the second modified example, the structure of the pellicle film, the film thickness of the pellicle film, CNTs, and the like are the same as in the first embodiment.

In the second modified example, the pellicle film may include other layers as in the first embodiment.

(3.2) Pellicle

The pellicle according to the second modified example includes the pellicle film according to the second modified example and a pellicle frame. The pellicle film is supported by a pellicle frame.

Since the pellicle according to the second modified example includes the pellicle film according to the second modified example, it has the same effects as those of the pellicle film according to the second modified example.

In the second modified example, the pellicle may further include an adhesive layer. The pellicle frame, the adhesive layer, and the like are the same as in the first embodiment.

(3.3) Exposure Original Plate

The exposure original plate according to the second modified example includes a photomask and the pellicle according to the second modified example. The photomask is an original plate with a circuit pattern. The pellicle is attached to a side of the photomask, on which a circuit pattern is formed.

Since the exposure original plate according to the second modified example includes the pellicle according to the second modified example, it has the same effects as those of the pellicle according to the second modified example.

The attachment method, the photomask, and the like are the same as in the first embodiment.

(3.4) Exposure Device

The exposure device according to the second modified example includes an EUV light source, the exposure original plate according to the second modified example, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the second modified example has the same effects as the exposure original plate according to the second modified example. Further, since the exposure device according to the second modified example has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(3.5) Method of Producing Pellicle Film

The method of producing a pellicle film according to the second modified example is a method of producing the pellicle film according to the second modified example, which includes a coating step. In the coating step, a dispersion liquid in which a plurality of CNTs synthesized by the direct injection pyrolytic synthesis method is dispersed is applied to a substrate.

Since the method of producing a pellicle film according to the second modified example has the above-described configuration, a pellicle film having a first diffraction peak ratio of 2 or more is obtained.

It is preferable that the method of producing a pellicle film according to the second modified example includes a preparation step, a dispersion liquid preparation step, a cleaning step, and a separation step in addition to the coating step. The coating step, the preparation step, the dispersion liquid preparation step, the cleaning step, the separation step, and the lie are the same as in the first embodiment.

In the second modified example, it is preferable that the method of producing a pellicle film further includes a cleaning step of alkaline-cleaning a coating film obtained in the coating step. Accordingly, a pellicle film is obtained from which the dispersant contained in the coating film has been removed.

(4) Third Modified Example (Second Diffraction Peak Ratio)

(4.1) Pellicle Film

The pellicle film according to the third modified example includes a plurality of CNTs forming a bundle and may have a second diffraction peak ratio of 1.3 or more.

In the third modified example, as the pellicle film has the above-described configuration, it is unlikely to experience film reduction even when exposed to hydrogen plasma. It is presumed that this is due to the same reasons as in the first embodiment.

The pellicle according to the third modified example is the same as the pellicle according to the first embodiment except that the second diffraction peak ratio may be 1.3 or more, and the average value of linearity parameters represented by Formula (1) above is not necessarily 0.10 or less. The description of the first embodiment of the disclosure can be used for the description of the third modified example of the disclosure.

The second diffraction peak ratio, a preferred range of the second diffraction peak ratio, a method of measuring the second diffraction peak ratio, and the like are the same as in the first embodiment.

In the third modified example, the average value of linearity parameters represented by Formula (1) above of a plurality of CNTs is preferably 0.10 or less.

As long as the average value of linearity parameters of a plurality of CNTs is 0.10 or less, film reduction is less likely to occur even under exposure to hydrogen plasma. It is presumed that this is due to the same reasons as in the first embodiment.

The linearity parameter, a preferred range of the average value of linearity parameters, a method of measuring the linearity parameter, and the like are the same as in the first embodiment.

In the third modified example, a plurality of CNTs form a plurality of bundles, and the average value of packing density parameters represented by Formula (2) above of the plurality of bundles may be 0.20 or less.

In the third modified example, as the pellicle film has the above-described configuration, it is unlikely to experience film reduction even when exposed to hydrogen plasma. It is presumed that this is due to the same reasons as in the first embodiment.

The packing density parameter, a preferred range of the average value of packing density parameters, a method of measuring the packing density parameter, and the like are the same as in the first embodiment.

In the third modified example, the average value of packing density parameters of a plurality of bundles is preferably 0.15 or less.

As long as the average value of packing density parameters of a plurality of bundles is 0.15 or less, film reduction of a pellicle film can be further suppressed even when the pellicle film is exposed to hydrogen plasma.

In the third modified example, it is preferable that the pellicle film includes a plurality of carbon nanotubes forming a bundle and has a smoothness evaluation value of 0.070 ($nm^2$/nm) or less.

As long as the smoothness evaluation value is within the above-described range, even when the pellicle film is exposed to hydrogen plasma, the film reduction of the pellicle film can be suppressed.

The smoothness evaluation value, a preferred range of the smoothness evaluation value, a method of measuring the smoothness evaluation value, and the like are the same as in the first embodiment.

In the third modified example, it is preferable that the pellicle film includes a plurality of carbon nanotubes forming a bundle, for which the ratio (G/D) is 0.8 or more.

As long as the ratio (G/D) is within the above-described range, when the CNTs and the hydrogen plasma react with each other to etch the CNTs, the etching reaction of the CNTs hardly progresses.

The ratio (G/D), a preferred range of the ratio (G/D), a method of measuring the ratio (G/D), and the like are the same as in the first embodiment.

The first diffraction peak ratio, the average gap area proportion, the method of evaluating the first lifetime of a pellicle film, the method of evaluating the first lifetime of a pellicle film, and the like are the same as in the first embodiment.

In the third modified example, the structure of the pellicle film, the film thickness of the pellicle film, CNTs, and the like are the same as in the first embodiment.

In the third modified example, the pellicle film may include other layers as in the first embodiment.

(4.2) Pellicle

The pellicle according to the third modified example includes the pellicle film according to the third modified example and a pellicle frame. The pellicle film is supported by a pellicle frame.

Since the pellicle according to the third modified example includes the pellicle film according to the third modified example, it has the same effects as those of the pellicle film according to the third modified example.

In the third modified example, the pellicle may further include an adhesive layer. The pellicle frame, the adhesive layer, and the like are the same as in the first embodiment.

(4.3) Exposure Original Plate

The exposure original plate according to the third modified example includes a photomask and the pellicle according to the third modified example. The photomask is an original plate with a circuit pattern. The pellicle is attached to a side of the photomask, on which a circuit pattern is formed.

Since the exposure original plate according to the third modified example includes the pellicle according to the third modified example, it has the same effects as those of the pellicle according to the third modified example.

The attachment method, the photomask, and the like are the same as in the first embodiment.

(4.4) Exposure Device

The exposure device according to the third modified example includes an EUV light source, the exposure original plate according to the third modified example, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the third modified example has the same effects as the exposure original plate according to the third modified example. Further, since the exposure device according to the third modified example has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(4.5) Method of Producing Pellicle Film

The method of producing a pellicle film according to the third modified example is a method of producing the pellicle film according to the third modified example, which includes a coating step. In the coating step, a dispersion liquid in which a plurality of CNTs synthesized by the direct injection pyrolytic synthesis method is dispersed is applied to a substrate.

Since the method of producing a pellicle film according to the third modified example has the above-described configuration, a pellicle film having a second diffraction peak ratio of 1.3 or more is obtained.

It is preferable that the method of producing a pellicle film according to the third modified example includes a preparation step, a dispersion liquid preparation step, a cleaning step, and a separation step in addition to the coating step. The coating step, the preparation step, the dispersion liquid preparation step, the cleaning step, the separation step, and the lie are the same as in the first embodiment.

In the third modified example, it is preferable that the method of producing a pellicle film further includes a cleaning step of alkaline-cleaning a coating film obtained in the coating step. Accordingly, a pellicle film is obtained from which the dispersant contained in the coating film has been removed.

(5) Fourth Modified Example (Smoothness Evaluation Value)

(5.1) Pellicle Film

The pellicle film according to the fourth modified example includes a plurality of CNTs forming a bundle and may have a smoothness evaluation value of 0.070 nm or less.

In the fourth modified example, as the pellicle film has the above-described configuration, it is unlikely to experience film reduction even when exposed to hydrogen plasma. It is presumed that this is due to the same reasons as in the first embodiment.

The pellicle according to the fourth modified example is the same as the pellicle according to the first embodiment except that the smoothness evaluation value may be 0.070 nm or less, and the average value of linearity parameters represented by Formula (1) above is not necessarily 0.10 or less. The description of the first embodiment of the disclosure can be used for the description of the fourth modified example of the disclosure.

The smoothness evaluation value, a preferred range of the smoothness evaluation value, a method of measuring the smoothness evaluation value, and the like are the same as in the first embodiment.

In the fourth modified example, the average value of linearity parameters represented by Formula (1) above of a plurality of CNTs is preferably 0.10 or less.

As long as the average value of linearity parameters of a plurality of CNTs is 0.10 or less, film reduction is less likely to occur even under exposure to hydrogen plasma. It is presumed that this is due to the same reasons as in the first embodiment.

The linearity parameter, a preferred range of the average value of linearity parameters, a method of measuring the linearity parameter, and the like are the same as in the first embodiment.

In the fourth modified example, a plurality of CNTs form a plurality of bundles, and the average value of packing density parameters represented by Formula (2) above of the plurality of bundles may be 0.20 or less.

In the fourth modified example, as the pellicle film has the above-described configuration, it is unlikely to experience film reduction even when exposed to hydrogen plasma. It is presumed that this is due to the same reasons as in the first embodiment.

The packing density parameter, a preferred range of the average value of packing density parameters, a method of measuring the packing density parameter, and the like are the same as in the first embodiment.

In the fourth modified example, the average value of packing density parameters of a plurality of bundles is preferably 0.15 or less.

As long as the average value of packing density parameters of a plurality of bundles is 0.15 or less, film reduction of a pellicle film can be further suppressed even when the pellicle film is exposed to hydrogen plasma.

In the fourth modified example, it is preferable that the pellicle film includes a plurality of carbon nanotubes forming a bundle, and the second diffraction peak ratio is 1.3 or more.

As long as the second diffraction peak ratio is within the above-described range, the diffusion of hydrogen radicals into a single bundle is further suppressed. As a result, the pellicle film exhibits higher lifetime characteristics and is unlikely to experience film reduction even when exposed to hydrogen plasma.

The second diffraction peak ratio, a preferred range of the second diffraction peak ratio, a method of measuring the second diffraction peak, and the like are the same as in the first embodiment.

In the fourth modified example, it is preferable that the pellicle film includes a plurality of carbon nanotubes forming a bundle, for which the ratio (G/D) is 0.8 or more.

As long as the ratio (G/D) is within the above-described range, when the CNTs and the hydrogen plasma react with each other to etch the CNTs, the etching reaction of the CNTs hardly progresses.

The ratio (G/D), a preferred range of the ratio (G/D), a method of measuring the ratio (G/D), and the like are the same as in the first embodiment.

The first diffraction peak ratio, the average gap area proportion, the method of evaluating the first lifetime of a pellicle film, the method of evaluating the first lifetime of a pellicle film, and the like are the same as in the first embodiment.

In the fourth modified example, the structure of the pellicle film, the film thickness of the pellicle film, CNTs, and the like are the same as in the first embodiment.

In the fourth modified example, the pellicle film may include other layers as in the first embodiment.

(5.2) Pellicle

The pellicle according to the fourth modified example includes the pellicle film according to the fourth modified example and a pellicle frame. The pellicle film is supported by a pellicle frame.

Since the pellicle according to the fourth modified example includes the pellicle film according to the fourth modified example, it has the same effects as those of the pellicle film according to the fourth modified example.

In the fourth modified example, the pellicle may further include an adhesive layer. The pellicle frame, the adhesive layer, and the like are the same as in the first embodiment.

(5.3) Exposure Original Plate

The exposure original plate according to the fourth modified example includes a photomask and the pellicle according to the fourth modified example. The photomask is an original plate with a circuit pattern. The pellicle is attached to a side of the photomask, on which a circuit pattern is formed.

Since the exposure original plate according to the fourth modified example includes the pellicle according to the fourth modified example, it has the same effects as those of the pellicle according to the fourth modified example.

The attachment method, the photomask, and the like are the same as in the first embodiment.

(5.4) Exposure Device

The exposure device according to the fourth modified example includes an EUV light source, the exposure original plate according to the fourth modified example, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the fourth modified example has the same effects as the exposure original plate according to the fourth modified example. Further, since the exposure device according to the fourth modified example has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(5.5) Method of Producing Pellicle Film

The method of producing a pellicle film according to the fourth modified example is a method of producing the pellicle film according to the fourth modified example, which includes a coating step. In the coating step, a dispersion liquid in which a plurality of CNTs synthesized by the direct injection pyrolytic synthesis method is dispersed is applied to a substrate.

Since the method of producing a pellicle film according to the fourth modified example has the above-described configuration, a pellicle film having a smoothness evaluation value of 0.070 nm or less is obtained.

It is preferable that the method of producing a pellicle film according to the fourth modified example includes a preparation step, a dispersion liquid preparation step, a cleaning step, and a separation step in addition to the coating step. The coating step, the preparation step, the dispersion liquid preparation step, the cleaning step, the separation step, and the lie are the same as in the first embodiment.

In the fourth modified example, it is preferable that the method of producing a pellicle film further includes a cleaning step of alkaline-cleaning a coating film obtained in the coating step. Accordingly, a pellicle film is obtained from which the dispersant contained in the coating film has been removed.

(6) Fifth Modified Example (Average Gap Area Proportion)

(6.1) Pellicle Film

The pellicle film according to the fifth modified example includes a plurality of CNTs, the plurality of CNTs form a bundle, and the pellicle film may have an average gap area proportion of 30% or less.

In the fifth modified example, as the pellicle film has the above-described configuration, it is unlikely to experience film reduction even when exposed to hydrogen plasma. It is presumed that this is due to the same reasons as in the first embodiment.

The pellicle according to the fifth modified example is the same as the pellicle according to the first embodiment except that the average gap area proportion may be 30% or less, and the average value of linearity parameters represented by Formula (1) above is not necessarily 0.10 or less. The description of the first embodiment of the disclosure can be used for the description of the fifth modified example of the disclosure.

The gap area proportion, a preferred range of the gap area proportion, a method of measuring the gap area proportion, and the like are the same as in the first embodiment.

In the fifth modified example, the average value of linearity parameters represented by Formula (1) above of a plurality of CNTs is preferably 0.10 or less.

As long as the average value of linearity parameters of a plurality of CNTs is 0.10 or less, film reduction is less likely to occur even under exposure to hydrogen plasma. It is presumed that this is due to the same reasons as in the first embodiment.

The linearity parameter, a preferred range of the average value of linearity parameters, a method of measuring the linearity parameter, and the like are the same as in the first embodiment.

In the fifth modified example, a plurality of CNTs form a plurality of bundles, and the average value of packing density parameters represented by Formula (2) above of the plurality of bundles may be 0.20 or less.

In the fifth modified example, as the pellicle film has the above-described configuration, it is unlikely to experience film reduction even when exposed to hydrogen plasma. It is presumed that this is due to the same reasons as in the first embodiment.

The packing density parameter, a preferred range of the average value of packing density parameters, a method of measuring the packing density parameter, and the like are the same as in the first embodiment.

In the fifth modified example, the average value of packing density parameters of a plurality of bundles is preferably 0.15 or less.

As long as the average value of packing density parameters of a plurality of bundles is 0.15 or less, film reduction of a pellicle film can be further suppressed even when the pellicle film is exposed to hydrogen plasma.

In the fifth modified example, it is preferable that the pellicle film includes a plurality of carbon nanotubes forming a bundle, and the second diffraction peak ratio is 1.3 or more.

As long as the second diffraction peak ratio is within the above-described range, the diffusion of hydrogen radicals into a single bundle is further suppressed. As a result, the pellicle film exhibits higher lifetime characteristics and is unlikely to experience film reduction even when exposed to hydrogen plasma.

The second diffraction peak ratio, a preferred range of the second diffraction peak ratio, a method of measuring the second diffraction peak, and the like are the same as in the first embodiment.

In the fifth modified example, it is preferable that the pellicle film includes a plurality of carbon nanotubes forming a bundle and has a smoothness evaluation value of 0.070 ($nm^2/nm$) or less.

As long as the smoothness evaluation value is within the above-described range, even when the pellicle film is exposed to hydrogen plasma, the film reduction of the pellicle film can be suppressed.

The smoothness evaluation value, a preferred range of the smoothness evaluation value, a method of measuring the smoothness evaluation value, and the like are the same as in the first embodiment.

In the fifth modified example, it is preferable that the pellicle film includes a plurality of carbon nanotubes forming a bundle, for which the ratio (G/D) is 0.8 or more.

As long as the ratio (G/D) is within the above-described range, when the CNTs and the hydrogen plasma react with each other to etch the CNTs, the etching reaction of the CNTs hardly progresses.

The ratio (G/D), a preferred range of the ratio (G/D), a method of measuring the ratio (G/D), and the like are the same as in the first embodiment.

The first diffraction peak ratio, the average gap area proportion, the method of evaluating the first lifetime of a pellicle film, the method of evaluating the first lifetime of a pellicle film, and the like are the same as in the first embodiment.

In the fifth modified example, the structure of the pellicle film, the film thickness of the pellicle film, CNTs, and the like are the same as in the first embodiment.

In the fifth modified example, the pellicle film may include other layers as in the first embodiment.

(6.2) Pellicle

The pellicle according to the fifth modified example includes the pellicle film according to the fifth modified example and a pellicle frame. The pellicle film is supported by a pellicle frame.

Since the pellicle according to the fifth modified example includes the pellicle film according to the fifth modified example, it has the same effects as those of the pellicle film according to the fifth modified example.

In the fifth modified example, the pellicle may further include an adhesive layer. The pellicle frame, the adhesive layer, and the like are the same as in the first embodiment.

(6.3) Exposure Original Plate

The exposure original plate according to the fifth modified example includes a photomask and the pellicle according to the fifth modified example. The photomask is an original plate with a circuit pattern. The pellicle is attached to a side of the photomask, on which a circuit pattern is formed.

Since the exposure original plate according to the fifth modified example includes the pellicle according to the fifth modified example, it has the same effects as those of the pellicle according to the fifth modified example.

The attachment method, the photomask, and the like are the same as in the first embodiment.

(6.4) Exposure Device

The exposure device according to the fifth modified example includes an EUV light source, the exposure original plate according to the fifth modified example, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the fifth modified example has the same effects as the exposure original plate according to the fifth modified example. Further, since the exposure device according to the fifth modified example has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(6.5) Method of Producing Pellicle Film

The method of producing a pellicle film according to the fifth modified example is a method of producing the pellicle film according to the fifth modified example, which includes a coating step. In the coating step, a dispersion liquid in which a plurality of CNTs synthesized by the direct injection pyrolytic synthesis method is dispersed is applied to a substrate.

Since the method of producing a pellicle film according to the fifth modified example has the above-described configuration, a pellicle film having an average gap area proportion of 30% or less is obtained.

It is preferable that the method of producing a pellicle film according to the fifth modified example includes a preparation step, a dispersion liquid preparation step, a cleaning step, and a separation step in addition to the coating step. The coating step, the preparation step, the dispersion liquid preparation step, the cleaning step, the separation step, and the lie are the same as in the first embodiment.

In the fifth modified example, it is preferable that the method of producing a pellicle film further includes a cleaning step of alkaline-cleaning a coating film obtained in the coating step. Accordingly, a pellicle film is obtained from which the dispersant contained in the coating film has been removed.

(7) Sixth Modified Example (Defect (G/D) Distribution)

(7.1) Pellicle Film

It is preferable that the pellicle film according to the sixth modified example includes a plurality of carbon nanotubes (CNTs) forming a bundle, for which the ratio (G/D) is 0.8 or more.

As long as the ratio (G/D) is within the above-described range, when the CNTs and the hydrogen plasma react with each other to etch the CNTs, the etching reaction of the CNTs hardly progresses.

The pellicle according to the sixth modified example is the same as the pellicle according to the first embodiment except that the ratio (G/D) may be 0.8 or more, and the average value of linearity parameters represented by Formula (1) above is not necessarily 0.10 or less. The description of the first embodiment of the disclosure can be used for the description of the sixth modified example of the disclosure.

The ratio (G/D), a preferred range of the ratio (G/D), a method of measuring the ratio (G/D), and the like are the same as in the first embodiment.

In the sixth modified example, the average value of linearity parameters represented by Formula (1) above of a plurality of CNTs is preferably 0.10 or less.

As long as the average value of linearity parameters of a plurality of CNTs is 0.10 or less, film reduction is less likely to occur even under exposure to hydrogen plasma. It is presumed that this is due to the same reasons as in the first embodiment.

The linearity parameter, a preferred range of the average value of linearity parameters, a method of measuring the linearity parameter, and the like are the same as in the first embodiment.

In the sixth modified example, a plurality of CNTs form a plurality of bundles, and the average value of packing density parameters represented by Formula (2) above of the plurality of bundles may be 0.20 or less.

In the sixth modified example, as the pellicle film has the above-described configuration, it is unlikely to experience film reduction even when exposed to hydrogen plasma. It is presumed that this is due to the same reasons as in the first embodiment.

The packing density parameter, a preferred range of the average value of packing density parameters, a method of measuring the packing density parameter, and the like are the same as in the first embodiment.

In the sixth modified example, the average value of packing density parameters of a plurality of bundles is preferably 0.15 or less.

As long as the average value of packing density parameters of a plurality of bundles is 0.15 or less, film reduction of a pellicle film can be further suppressed even when the pellicle film is exposed to hydrogen plasma.

In the sixth modified example, it is preferable that the pellicle film includes a plurality of carbon nanotubes forming a bundle, and the second diffraction peak ratio is 1.3 or more.

As long as the second diffraction peak ratio is within the above-described range, the diffusion of hydrogen radicals into a single bundle is further suppressed. As a result, the pellicle film exhibits higher lifetime characteristics and is unlikely to experience film reduction even when exposed to hydrogen plasma.

The second diffraction peak ratio, a preferred range of the second diffraction peak ratio, a method of measuring the second diffraction peak, and the like are the same as in the first embodiment.

In the sixth modified example, it is preferable that the pellicle film includes a plurality of carbon nanotubes forming a bundle and has a smoothness evaluation value of 0.070 ($nm^2$/nm) or less.

As long as the smoothness evaluation value is within the above-described range, even when the pellicle film is exposed to hydrogen plasma, the film reduction of the pellicle film can be suppressed.

The smoothness evaluation value, a preferred range of the smoothness evaluation value, a method of measuring the smoothness evaluation value, and the like are the same as in the first embodiment.

The first diffraction peak ratio, the average gap area proportion, the method of evaluating the first lifetime of a pellicle film, the method of evaluating the first lifetime of a pellicle film, and the like are the same as in the first embodiment.

In the sixth modified example, the structure of the pellicle film, the film thickness of the pellicle film, CNTs, and the like are the same as in the first embodiment.

In the sixth modified example, the pellicle film may include other layers as in the first embodiment.

(7.2) Pellicle

The pellicle according to the sixth modified example includes the pellicle film according to the sixth modified example and a pellicle frame. The pellicle film is supported by a pellicle frame.

Since the pellicle according to the sixth modified example includes the pellicle film according to the sixth modified example, it has the same effects as those of the pellicle film according to the sixth modified example.

In the sixth modified example, the pellicle may further include an adhesive layer. The pellicle frame, the adhesive layer, and the like are the same as in the first embodiment.

(7.3) Exposure Original Plate

The exposure original plate according to the sixth modified example includes a photomask and the pellicle according to the sixth modified example. The photomask is an original plate with a circuit pattern. The pellicle is attached to a side of the photomask, on which a circuit pattern is formed.

Since the exposure original plate according to the sixth modified example includes the pellicle according to the sixth modified example, it has the same effects as those of the pellicle according to the sixth modified example.

The attachment method, the photomask, and the like are the same as in the first embodiment.

(7.4) Exposure Device

The exposure device according to the sixth modified example includes an EUV light source, the exposure original plate according to the sixth modified example, and an optical system. The EUV light source emits EUV light as exposure light. The optical system guides the exposure light emitted from the EUV light source to the exposure original plate. The exposure original plate is arranged such that the exposure light emitted from the EUV light source passes through the pellicle film to be irradiated on the photomask.

Therefore, the exposure device according to the sixth modified example has the same effects as the exposure original plate according to the sixth modified example. Further, since the exposure device according to the sixth modified example has the above-described configuration, it can form a refined pattern (e.g., having a line width of 32 nm or less) and perform pattern exposure with reduced resolution failure due to foreign matter.

A known EUV light source can be used as the EUV light source. A known optical system can be used as the optical system.

(7.5) Method of Producing Pellicle Film

The method of producing a pellicle film according to the sixth modified example is a method of producing the pellicle film according to the sixth modified example, which includes a coating step. In the coating step, a dispersion liquid in which a plurality of CNTs synthesized by the direct injection pyrolytic synthesis method is dispersed is applied to a substrate.

Since the method of producing a pellicle film according to the sixth modified example has the above-described configuration, a pellicle film having a ratio (G/D) of 0.8 or more is obtained.

It is preferable that the method of producing a pellicle film according to the sixth modified example includes a preparation step, a dispersion liquid preparation step, a cleaning step, and a separation step in addition to the coating step. The coating step, the preparation step, the dispersion liquid preparation step, the cleaning step, the separation step, and the lie are the same as in the first embodiment.

In the sixth modified example, it is preferable that the method of producing a pellicle film further includes a cleaning step of alkaline-cleaning a coating film obtained in the coating step. Accordingly, a pellicle film is obtained from which the dispersant contained in the coating film has been removed.

The embodiments of the disclosure have been described above with reference to the drawings. However, the disclosure is not limited to the above-described embodiments and can be carried out in various aspects without departing from the scope of the disclosure. To make the drawings easier to understand, the drawings schematically show each element mainly, and the thickness, length, number, and the like of each element illustrated, are different from the actual ones due to the convenience of creating the drawings. The material, shape, dimension, and the like of each element shown in the above-described embodiments are examples and are not particularly limited, and various changes are possible without substantially departing from the effects of the disclosure.

EXAMPLES

Hereinafter, the disclosure will be described in more detail with reference to Examples and the like, but the invention of the disclosure is not limited only to these examples.

In Examples, the film thickness of the exposure region and the film thickness of the peripheral region were determined by the method described above.

Example 1

[Preparation Step]
A plurality of single-layer CNTs (manufactured by Meijo Nano Carbon; trade name: "EC1.5-P;" tube diameter: from 1 nm to 3 nm; tube length: 100 nm or more) synthesized by the eDIPS method were prepared as a plurality of CNTs.
[Dispersion Liquid Preparation Step]
To 30 mg of a plurality of CNTs, 70 mL of isopropyl alcohol and 30 mL of ethanol were added, and 30 mg of polyacrylic acid was further added as an additive, followed by stirring with a magnetic stirrer at 1000 rpm (revolutions per minute) and 40° C. for 18 hours. The resulting suspension was ultrasonically dispersed using a probe-type homogenizer at an output of 40% for a total of 30 minutes, thereby obtaining a CNT dispersion liquid.
[Coating Step]
An 8-inch size silicon wafer (hereinafter referred to as "silicon substrate") was prepared. The CNT dispersion liquid was spin-coated onto the silicon substrate at a rotation speed of 1500 rpm. Thus, a coating film formed on the silicon substrate was obtained.
[Cleaning Step]
The coating film was alkaline-cleaned tetramethylammonium hydroxide (hereinafter referred to as "TMAH") to remove polyacrylic acid in the uncleaned CNT film, followed by drying. Thus, a CNT film was obtained.

Hereinafter, the silicon substrate and the CNT film formed on the silicon substrate will be collectively referred to as "film-coated silicon substrate."
[Separation Step]
The film-coated silicon substrate was immersed in a water bath. The CNT film was detached from the silicon substrate in the water. The CNT film detached from the silicon substrate was left in the water and the silicon substrate was removed from the water. At this time, the CNT film was floating on the water surface. Thus, a pellicle film consisting of a CNT film having a mesh structure was obtained.
[Pellicle Production Step]
As a pellicle frame, a frame body made of silicon (hereinafter also referred to as "pellicle frame") was prepared. The pellicle frame was a cylinder. The pellicle frame had a through hole. The through hole was formed along the thickness direction of the pellicle frame. The outline form of the through hole portion viewed from one side of the pellicle frame in the thickness direction was a square having a side length of 10 mm.

The CNT film floating on the water surface was scooped up with the pellicle frame. Thus, a pellicle in which a CNT film was arranged on the pellicle frame was obtained. The CNT film of the obtained pellicle was in contact with the pellicle frame and covered the entire through hole of the pellicle frame.

Example 2

A pellicle was obtained in the same manner as in Example 1, except that the CNT film was water-cleaned instead of cleaning the coating film with TMAH in the cleaning step.

Comparative Example 1

[Preparation Step]
As a CNT, a single-layer CNT was synthesized by the method (SG method) described in Patent Literature 2.
[Coating Step]
To 100 mL of toluene, 300 mg of CNTs synthesized by the SG method and 1 g of organic side chain flavin as a dispersant were added, followed by stirring with a magnetic stirrer at 480 rpm for 2 hours. Then, the resulting suspension was ultrasonically dispersed using a probe-type homogenizer at an output of 40% for a total of 2 hours while being ice-cooled for 5 minutes every 20 minutes. The obtained CNT dispersion liquid was defoamed.

A silicon substrate was prepared. A CNT dispersion liquid was blade-coated on the silicon substrate and dried. The gap between the blade and the silicon substrate was 25 μm. Thus, a CNT film having a mesh structure was obtained. The thickness of an uncleaned CNT film was 20 nm.

[Cleaning Step]

The uncleaned CNT film was cleaned with chloroform to remove organic side chain flavin in the uncleaned CNT film, followed by drying. Thus, a CNT film having a mesh structure was obtained.

[Separation Step and Pellicle Production Step]

A pellicle was obtained by carrying out the separation step and the pellicle production step in the same manner as in Example 1.

(Measurement of Linearity Parameter and Packing Density Parameter)

The linearity parameter and the packing density parameter were measured by the above-described method for the pellicles obtained in Examples 1 and 2 and Comparative Example 1. A transmission electron microscope image and a selected area electron beam diffraction image were obtained using a field emission transmission electron microscope (model: ARM200F manufactured by JEOL Ltd.) Thin sections for cross-sectional observation were made using a focused ion beam (FIB) processing equipment (model: Helios G4 UX manufactured by FEI Company Japan Ltd.). Table 2 shows the measurement results.

The pellicles obtained in Examples 1 and 2 and Comparative Example 1 included a plurality of CNTs. Most of the plurality of CNTs in Examples 1 and 2 and Comparative Example 1 consisted of single-layer and two-layer CNTs, and a few of them consisted of three-layer and four-layer CNTs, which formed a bundle.

(Measurement of First Diffraction Peak Ratio)

The first diffraction peak ratio was measured by the above-described method for the pellicle obtained in Example 1. Specifically, for the pellicle obtained in Example 1, regarding diffraction peaks centered at $q=2.0$ $nm^{-1}$ to $3.0$ $nm^{-1}$, the first diffraction peak ratio between the integrated value of peaks in the film thickness direction (area value in the Gauss function) and the integrated value of peaks in the film plane direction (area value in the Gauss function) was 35.

(Measurement of Second Diffraction Peak Ratio)

The second diffraction peak ratio was measured by the above-described method for the pellicles obtained in Example 1 and Comparative Example 1. The second diffraction peak ratio in Example 1 was 4.0. The second diffraction peak ratio in Comparative Example 1 was 1.0.

(Measurement of Smoothness Evaluation Value)

The smoothness evaluation value [$nm^2/nm$] was measured by the above-described method for the pellicle obtained in Example 1. The smoothness evaluation value [$nm^2/nm$] in Example 1 was 0.031 nm. The scale of the TEM image used in Example 1 was 0.02 nm per pixel.

(Measurement of Average Gap Area Proportion)

The average gap area proportion was measured by the above-described method for the pellicles obtained in Example 1 and Comparative Example 1. The average gap area proportion in Example 1 was 24%. The average gap area proportion in Comparative Example 1 was 36%.

(Measurement of Ratio (G/D))

The ratio (G/D) was measured by the above-described method for the pellicles obtained in Example 1 and Comparative Example 1. The minimum value of the ratio (G/D) in Example 1 was 1.10. The minimum value of the ratio (G/D) in Comparative Example 1 was 0.77.

(Measurement of Film Reduction Rate)

The film reduction rate was measured as follows for the pellicles obtained in Examples 1 and 2 and Comparative Example 1.

A silicon substrate was prepared. Ethanol was added dropwise onto the silicon substrate. A pellicle was placed on the silicon substrate such that the pellicle film of the pellicle was opposed to the silicon substrate. Ethanol was dried, thereby allowing the pellicle film to be closely attached to the silicon substrate. The silicon substrate was immobilized, and the pellicle frame of the pellicle was raised, thereby allowing a self-supporting film portion to be transferred to the silicon substrate. Thus, a test piece was obtained.

The film thickness of the self-supporting film portion of the test piece was measured by the above-described method. The thickness of the self-supporting film portion in Example 1 was 24 nm. The thickness of the self-supporting film portion in Example 2 was 23 nm. The thickness of the self-supporting film portion in Comparative Example 1 was 23 nm.

The test piece was irradiated with hydrogen plasma.

The self-supporting film portion is exposed to hydrogen plasma upon hydrogen plasma irradiation. As a result, the self-supporting film portion is exposed to a hydrogen plasma environment similar to the EUV exposure environment. Thus, etching and chemical changes occur in the self-supporting film portion. A decrease in film thickness occurs when the self-supporting film portion is etched by exposure to hydrogen plasma.

Specifically, using a parallel plate-type plasma CVD apparatus (manufactured by JAPANCREATE Co. Ltd.; cathode electrode size: Φ100 mm), the test piece was irradiated with hydrogen plasma under the following processing conditions. A test piece was placed on the anode electrode (grounded), and evacuation was performed for 30 minutes. Subsequently, the test piece was retained for 5 minutes while hydrogen gas flowed at 20 Pa and then irradiated with plasma.

<Hydrogen Plasma Processing Conditions>

Degree of vacuum achieved in the chamber: Pressure <$1e^{-3}$ Pa

Material gas: $H_2$ (G1 grade)

Gas flow: 50 sccm

Processing pressure: 20 Pa (0.15 Torr)

RF power: 100 W

Self-bias voltage: −490 V

Processing time: 120 seconds

The film thickness of the self-supporting film portion of the test piece irradiated with hydrogen plasma was measured by the above-described method.

The film reduction rate was calculated by the following Formula (3) using the measurement value of the film thickness of the self-supporting film portion before hydrogen plasma irradiation (hereinafter referred to as "pre-irradiation measurement value") and the measurement value of the film thickness of the self-supporting film portion after hydrogen plasma irradiation (hereinafter referred to as "post-irradiation measurement value"). Table 2 shows the calculation results.

A low film reduction rate indicates a low speed of etching of the self-supporting film portion by hydrogen plasma, i.e., a tendency to be hardly etched by hydrogen plasma irradiation. It can be said that a pellicle film having a low film reduction rate has a high EUV radiation resistance in the EUV exposure environment.

$$\text{Film reduction rate} = ((\text{Pre-irradiation measurement value} - \text{Post-irradiation measurement value})/\text{Pre-irradiation measurement value}) \times 100 \quad \text{Formula (3)}:$$

TABLE 2

|  | Unit | Example 1 | Example 2 | Comparative Example |
|---|---|---|---|---|
| CNT synthesis method | — | eDIPs method | eDIPs method | SG method |
| Cleaning step | — | Alkaline cleaning | Water cleaning | — |
| Linearity parameter | — | 0.039 | 0.040 | 0.120 |
| Packing density parameter | — | 0.13 | 0.18 | 0.25 |
| First diffraction peak ratio | — | 35 | — | — |
| Second diffraction peak ratio | — | 4.0 | — | 1.0 |
| Smoothness evaluation value | $nm^2/nm$ | 0.031 | — | 0.090 |
| Average gap area proportion | % | 24 | — | 36 |
| Ratio (G/D) | — | 1.10 | — | 0.77 |
| Film reduction rate | % | 20 | 30 | 33 |

Although the pellicle film in Comparative Example 1 included a plurality of CNTs, the average value of linearity parameters of the plurality of CNTs was more than 0.10. Therefore, the film reduction rate in Comparative Example 1 was 33%.

Each of the pellicle films in Examples 1 and 2 included a plurality of CNTs, and the average value of linearity parameters of the plurality of CNTs was 0.10 or less. Therefore, each of the film reduction rates in Examples 1 and 2 was 30% or less, which was lower than the film reduction rate in Comparative Example 1. As a result, it was found that the pellicle films in Examples 1 and 2 are unlikely to experience film reduction than before, even when exposed to hydrogen plasma.

A comparison between Example 1 and Example 2 showed that when the average value of packing density parameters of a plurality of bundles is 0.15 or less, film reduction is less likely to occur even with exposure to hydrogen plasma.

To precisely measure the amount of film reduction in a pellicle film having a thickness of 20 nm or less, thickness measurement is performed in a state in which the pellicle film is layered on a silicon substrate having a high reflectance in a wavelength range of from 220 nm to 300 nm, making it possible to detect a slight change in reflectance due to a change in film thickness. As a result, the thickness can be evaluated with a measurement precision of about 0.1 nm.

The disclosure of Japanese Patent Application No. 2021-138015 filed on Aug. 26, 2021 is incorporated herein by reference in its entirety.

All publications, patent applications, and technical standards mentioned herein are incorporated herein by reference to the same extent as if each of the individual publications, patent applications, and technical standards were specifically and individually noted to be incorporated by reference.

The invention claimed is:

1. A pellicle, which comprises:
a pellicle frame; and
a pellicle film which is supported by the pellicle frame,
wherein the pellicle film has a thickness of from 2 nm to 100 nm,
wherein the pellicle film comprises a plurality of carbon nanotubes,
wherein an average value of linearity parameters represented by the following Formula (1) of the plurality of carbon nanotubes is 0.10 or less:

linearity parameter=standard deviation $Sa$ of a width of one carbon nanotube/average value $Aa$ of the width     Formula (1):

wherein, in Formula (1), each of the standard deviation $Sa$ and the average value $Aa$ is calculated based on 11 measurement values obtained by measuring the width of one carbon nanotube at intervals of 2 nm along a longitudinal direction of the one carbon nanotube,
wherein the plurality of carbon nanotubes forms bundles, and
an average value of packing density parameters represented by the following Formula (2) of the plurality of bundles is 0.15 or less:

packing density parameter=standard deviation $Sb$ of distances between center points of a plurality of carbon nanotubes constituting one bundle/average value $Ab$ of the distances between center points     Formula (2):

wherein, in Formula (2):
the distances between center points each indicate a length of a straight line that connects center points, each of which is identified as a center point of an annular outline of each of a plurality of carbon nanotubes in a 20 nm×20 nm range of a transmission electron microscope image including one bundle on a cross-section of the pellicle film cut along a thickness direction of the pellicle film, such that a plurality of triangles meeting predetermined conditions are formed;
the predetermined conditions include that sides of each of the plurality of triangles do not intersect, that three of the center points are selected such that a sum of three side lengths of a triangle is minimized, and that an interior angle of an outermost triangle among the plurality of triangles is less than 120°;
each of the standard deviation $Sb$ and the average value $Ab$ is calculated based on a plurality of the distances between center points equal to or less than a predetermined value;
the predetermined value is obtained by multiplying 1.6 times the average value of the distances between center points, starting from a shortest length to a predetermined rank in order of the distances between center points; and
the predetermined rank is indicated by an integer obtained by rounding off to a first decimal place of a number obtained by multiplying a total number of a plurality of the distances between center points by 0.8.

2. The pellicle film according to claim 1, wherein the average value of packing density parameters is 0.10 or less.

3. The pellicle film according to claim 1, which comprises a plurality of carbon nanotubes forming a bundle and has a smoothness evaluation value of 0.070 ($nm^2/nm$) or less, wherein:
the smoothness evaluation value indicates a value obtained by dividing an area between an outline of a carbon nanotube and an approximate curve of the outline by a length of the approximate curve, the outline is a line obtained by tracing a wall portion of a carbon nanotube (CNT) that appears as a dark line in a transmission electron microscope image of a surface of the pellicle film at a resolution of 100 pixels or more with a length of 5 nm, the approximate curve is a curve drawn by quadratic spline interpolation of coordinates of the outline of the CNT, the outline and the approximate curve of the carbon nanotube are extracted from 20 carbon nanotubes, and the length of the outline per carbon nanotube is 20 nm.

4. The pellicle film according to claim 1, which comprises a plurality of carbon nanotubes forming a bundle, wherein:

a minimum value of a ratio (G/D) of a G-band intensity to a D-band intensity at 7 locations within a predetermined bundle region in a cross-section of the pellicle film, cut along a bundle axial direction is 0.80 or more, each of the D-band intensity and the G-band intensity is a measurement value obtained by Raman imaging measurement, the predetermined bundle region indicates a region in a bundle having a diameter of 10 nm or more at a spatial resolution of 20 nm or less in a 500 nm×500 nm measurement area of the cross-section, the D-band intensity is a local maximum value of Raman scattering intensity in a Raman shift range of from 1300 $cm^{-1}$ to 1400 $cm^{-1}$, and the G-band intensity is a local maximum value of Raman scattering intensity in a Raman shift range of from 1550 $cm^{-1}$ to 1610 $cm^{-1}$.

5. An exposure original plate, which comprises:
a photomask; and
the pellicle according to claim 1 which is attached to the photomask.

6. An exposure device, which comprises:
an EUV light source that emits EUV light as exposure light;
the exposure original plate according to claim 5; and
an optical system that guides the exposure light emitted from the EUV light source to the exposure original plate,
wherein the exposure original plate is arranged such that the exposure light emitted from the EUV light source passes through the pellicle film to be irradiated on the photomask.

7. A method of producing a pellicle that is the pellicle according to claim 1, which comprises
applying a dispersion liquid, in which a plurality of carbon nanotubes synthesized by a direct injection pyrolytic synthesis method is dispersed, to a substrate;
alkaline-cleaning a coating film obtained in the applying of the dispersion, to obtain a pellicle film; and
attaching the pellicle film to a pellicle frame such that the pellicle film is supported by the pellicle frame.

8. The method of producing a pellicle film according to claim 7, wherein the disperson liquid comprises at least one selected from the group consisting of isopropyl alcoyol, ethanol, toluene, xylene, ethylbenzene, n-methylpyrrolidone, N,N-dimethylformamide, propylene glycol, and methyl isobutyl ketone.

* * * * *